(12) United States Patent
Chen et al.

(10) Patent No.: US 12,538,544 B2
(45) Date of Patent: Jan. 27, 2026

(54) METHOD FOR MANUFACTURING SEMICONDUCTOR DEVICE

(71) Applicant: TAIWAN SEMICONDUCTOR MANUFACTURING COMPANY, LTD., Hsinchu (TW)

(72) Inventors: Kuo-Ju Chen, Taichung (TW); Wei-Ting Chang, Hsinchu (TW); Po-Kang Ho, Taoyuan (TW); Su-Hao Liu, Chiayi County (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 692 days.

(21) Appl. No.: 17/871,882

(22) Filed: Jul. 22, 2022

(65) Prior Publication Data
US 2024/0030312 A1    Jan. 25, 2024

(51) Int. Cl.
| | | |
|---|---|---|
| *H10D 64/01* | (2025.01) | |
| *H10D 30/01* | (2025.01) | |
| *H10D 30/43* | (2025.01) | |
| *H10D 30/67* | (2025.01) | |
| *H10D 30/69* | (2025.01) | |
| *H10D 62/10* | (2025.01) | |

(52) U.S. Cl.
CPC ......... *H10D 64/017* (2025.01); *H10D 30/014* (2025.01); *H10D 30/024* (2025.01); *H10D 30/43* (2025.01); *H10D 30/6735* (2025.01); *H10D 30/6757* (2025.01); *H10D 30/797* (2025.01); *H10D 62/121* (2025.01)

(58) Field of Classification Search
CPC ...... H10D 30/014; H10D 30/43; H10D 30/62; H10D 30/501–509; H10D 30/024–0245; H10D 30/0273; H10D 30/0614; H10D 30/6757; H10D 30/797; H10D 30/673–6736; H10D 62/121; H10D 84/0158; H10D 84/0193; H10D 84/834; H10D 84/853; H10D 86/011; H10D 86/215; H10D 64/017; H10B 12/056; H10B 12/36

See application file for complete search history.

(56) References Cited

U.S. PATENT DOCUMENTS

| | | | |
|---|---|---|---|
| 2013/0043517 A1* | 2/2013 | Yin ...................... | H10D 64/518 257/E21.409 |
| 2016/0276436 A1* | 9/2016 | Pan .................... | H01L 21/02636 |
| 2018/0151738 A1* | 5/2018 | Lin ..................... | H10D 84/0149 |
| 2019/0097011 A1* | 3/2019 | Wu ........................ | H10D 84/85 |
| 2021/0391182 A1* | 12/2021 | Chang ................ | H10D 84/0147 |

* cited by examiner

*Primary Examiner* — Sue A Purvis
*Assistant Examiner* — Aneta B Cieslewicz
(74) *Attorney, Agent, or Firm* — Maschoff Brennan

(57) ABSTRACT

A method includes forming a fin structure over a substrate; depositing a dummy gate layer over the substrate and the fin structure; etching back the dummy gate layer; performing an implantation process to the dummy gate layer to form an implantation region in the dummy gate layer, wherein a vertical thickness of the dummy gate layer is greater than a vertical thickness of the implantation region; forming a patterned hard mask stack over the implantation region; patterning the implantation region and the dummy gate layer by using the patterned hard mask stack as an etch mask to form a dummy gate structure over the fin structure; and replacing the dummy gate structure with a metal gate structure.

20 Claims, 44 Drawing Sheets

METHOD FOR MANUFACTURING SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
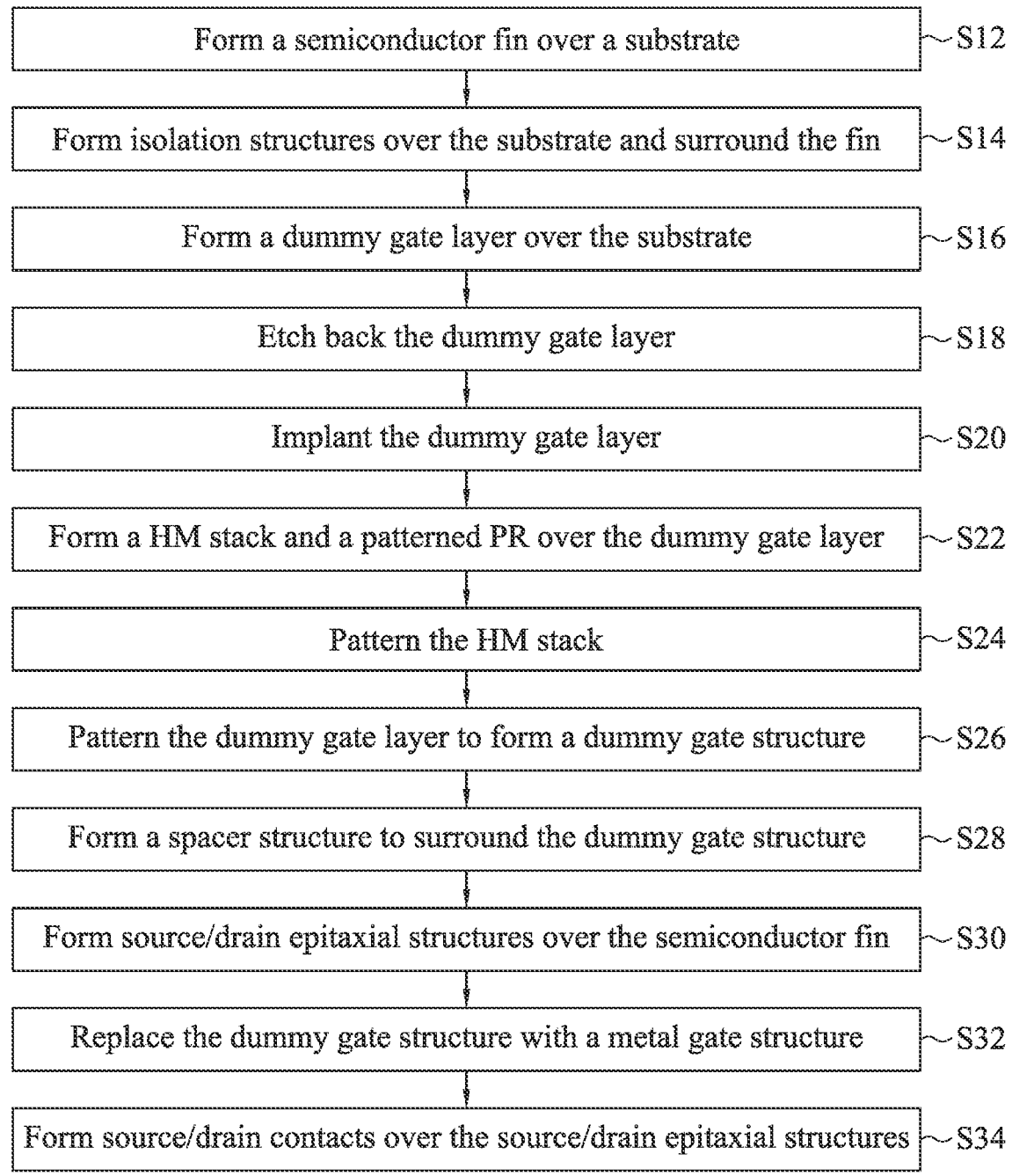
FIG. 1 is a flowchart of a method for manufacturing a semiconductor device (or an integrated circuit structure) according to aspects of the present disclosure in various embodiments.
Figure 2:
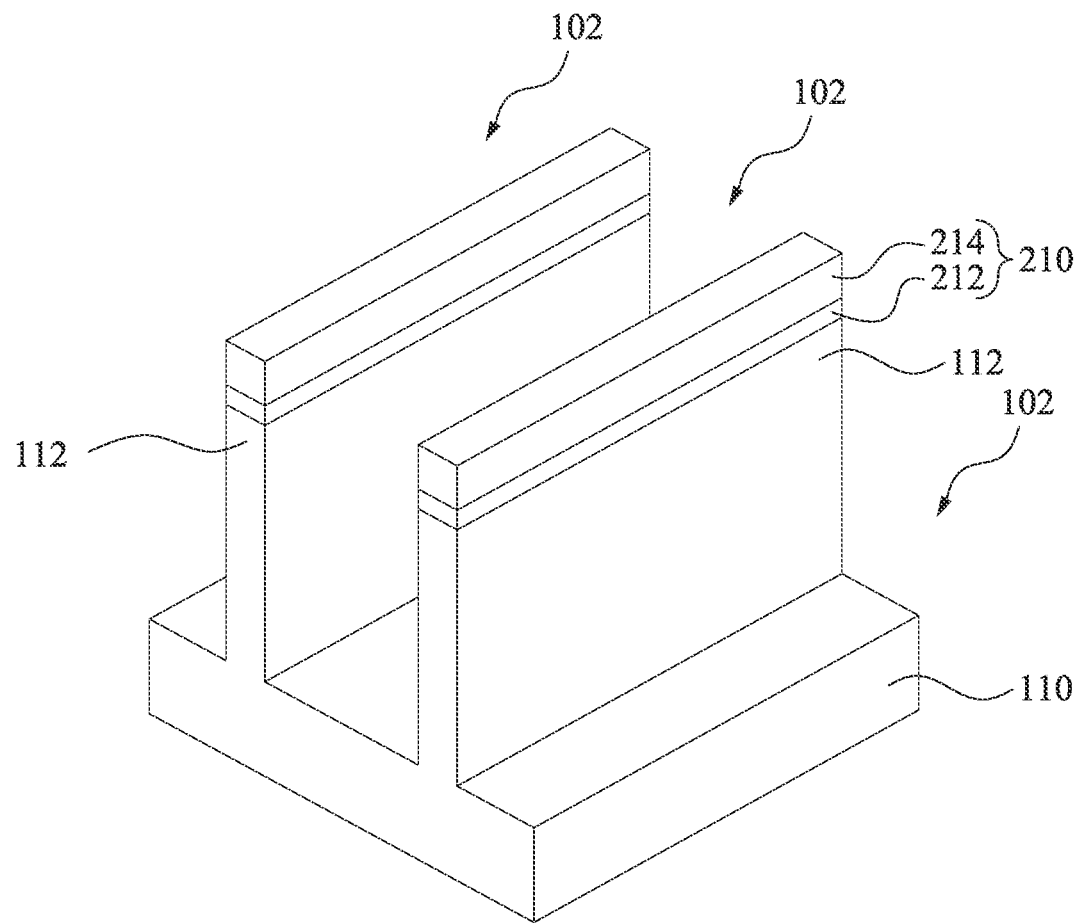
FIGS. 2-15 illustrate a method for manufacturing the semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The present disclosure is related to semiconductor devices and methods of forming the same. More particularly, some embodiments of the present disclosure are related to methods for improving the distortion of gates by implanting a dummy gate material prior to patterning the dummy gate material into dummy gates of the semiconductor devices.

FIG. 1 is a flowchart of a method Ma for manufacturing a semiconductor device (or an integrated circuit structure)

according to aspects of the present disclosure in various embodiments. Various operations of the method Ma are discussed in association with perspective diagrams FIGS. 2-15. Throughout the various views and illustrative embodiments, like reference numbers are used to designate like elements. FIGS. 2-15 illustrate a method for manufacturing the semiconductor device at various stages in accordance with some embodiments of the present disclosure. In addition to the semiconductor device, FIGS. 2-15 depict X-axis, Y-axis, and Z-axis directions. In some embodiments, the semiconductor device shown in FIGS. 2-15 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

In operation S12 of method Ma in FIG. 1, a semiconductor fin is formed over a substrate. For example, in FIG. 2, a substrate 110 is provided. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

One or more semiconductor fins 112 are formed on the substrate 110. The semiconductor fins 112 can be equivalently referred to as fin structures in some embodiments. The semiconductor fins 112 may be N-type or P-type. For example, one or some of the semiconductor fins 112 are N-type, and one or some of the semiconductor fins 112 are P-type. The semiconductor fins 112 may be formed using, for example, a patterning process to form trenches such that trenches are formed between adjacent semiconductor fins 112. As discussed in greater detail below, the semiconductor fins 112 will be used to form FinFETs. It is understood that two semiconductor fins 112 are illustrated for purposes of illustration, but other embodiments may include any number of semiconductor fins. In some embodiments, one or more dummy semiconductor fins are formed adjacent to the semiconductor fins 112.

The semiconductor fins 112 may be formed by performing an etching process to the substrate 110. Specifically, a patterned hard mask structure 210 is formed over the substrate 110. In some embodiments, the patterned hard mask structure 210 is formed of silicon nitride, silicon oxynitride, silicon carbide, silicon carbon-nitride, or the like. For example, the patterned hard mask structure 210 includes an oxide pad layer 212 and a nitride mask layer 214 over the oxide pad layer 212. The patterned hard mask structure 210 covers a portion of the substrate 110 while leaves another portion of the substrate 110 uncovered. The substrate 110 is then patterned using the patterned hard mask structure 210 as a mask to form trenches 102. Accordingly, the semiconductor fins 112 are formed.

Figure 3:
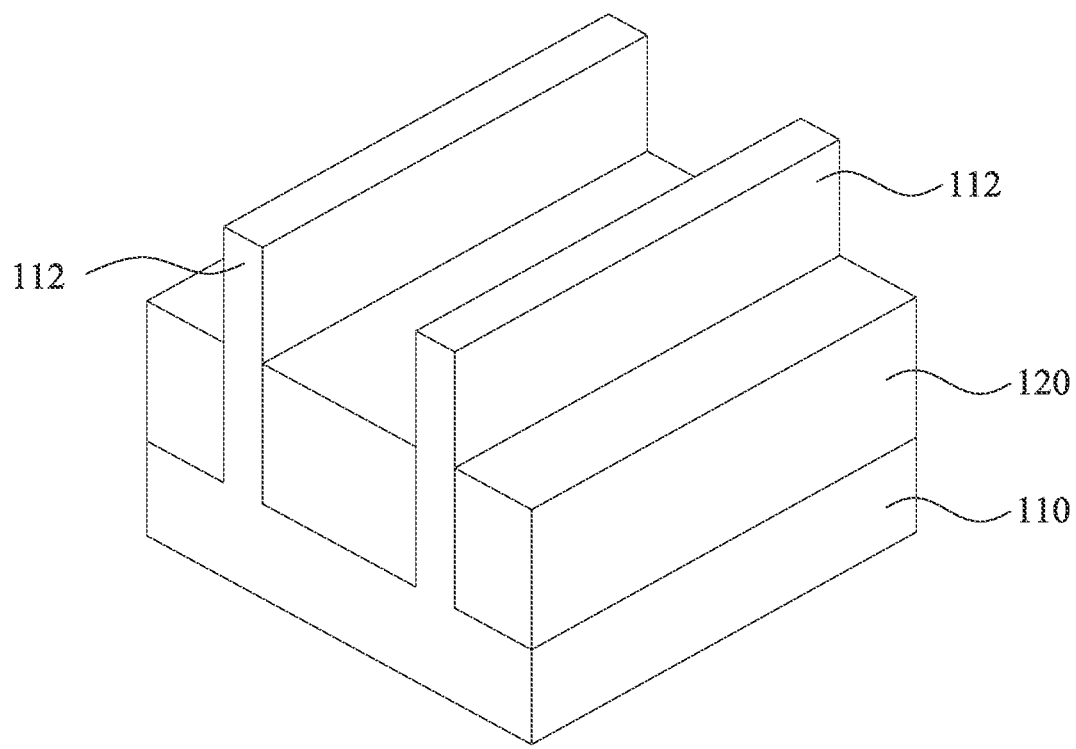
Figure 3:
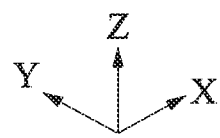

In operation S14 of method Ma in FIG. 1, isolation structures are formed over the substrate and surround the semiconductor fin. For example, in FIG. 3, isolation structures 120, such as shallow trench isolations (STI), are disposed in trenches 102 (see FIG. 2) and over the substrate 110. The isolation structures 120 can be equivalently referred to as an isolation insulating layer in some embodiments. The isolation structures 120 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 120 are formed through a process such as CVD, flowable CVD (FCVD), or a spin-on-glass process, although any acceptable process may be utilized. Subsequently, portions of the isolation structures 120 extending over the top surfaces of the semiconductor fins 112, are removed using, for example, an etching back process, chemical mechanical polishing (CMP), or the like.

The isolation structures 120 are then recessed to expose upper portions of the semiconductor fins 112 as illustrated in FIG. 3. In some embodiments, the isolation structures 120 are recessed using a single etch processes, or multiple etch processes. In some embodiments in which the isolation structures 120 is made of silicon oxide, the etch process may be, for example, a dry etch, a chemical etch, or a wet cleaning process. For example, the chemical etch may employ fluorine-containing chemical such as dilute hydrofluoric (dHF) acid.

Figure 4:
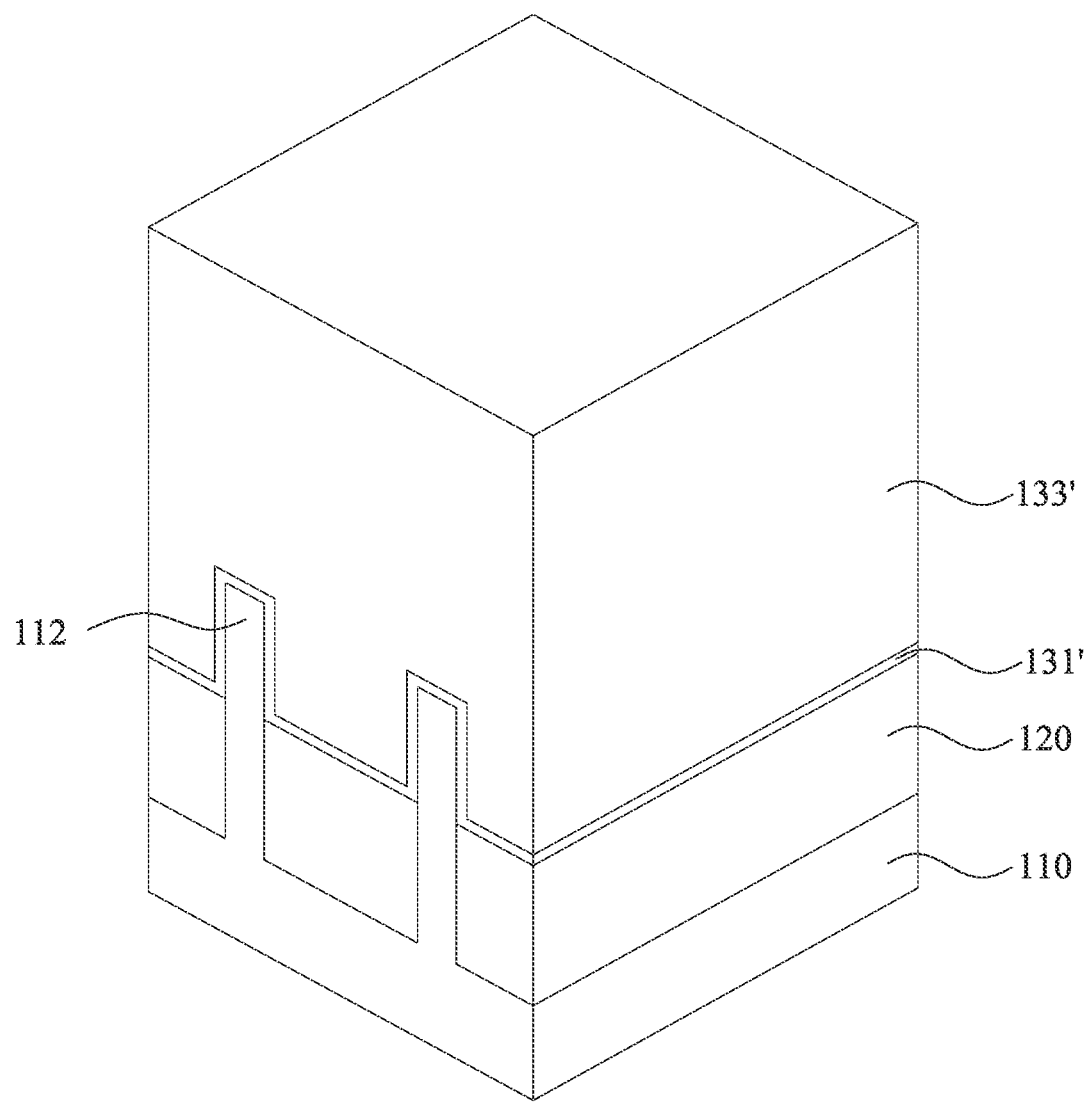

In operation S16 of method Ma in FIG. 1, a dummy gate layer is formed over the substrate. Specifically, as shown in FIG. 4, a dummy dielectric layer 131' is formed over the substrate 110 and covering the semiconductor fins 112. The dummy dielectric layer 131' may be, for example, silicon oxide, silicon nitride, a combination thereof, or the like, and may be deposited or thermally grown according to acceptable techniques. A dummy gate layer 133' is then formed over the dummy dielectric layer 131'. The dummy gate layer 133' may be deposited over the dummy dielectric layer 131' and then planarized, such as by a CMP. The dummy gate layer 133' may include polycrystalline-silicon (poly-Si) or polycrystalline silicon-germanium (poly-SiGe).

Figure 5:
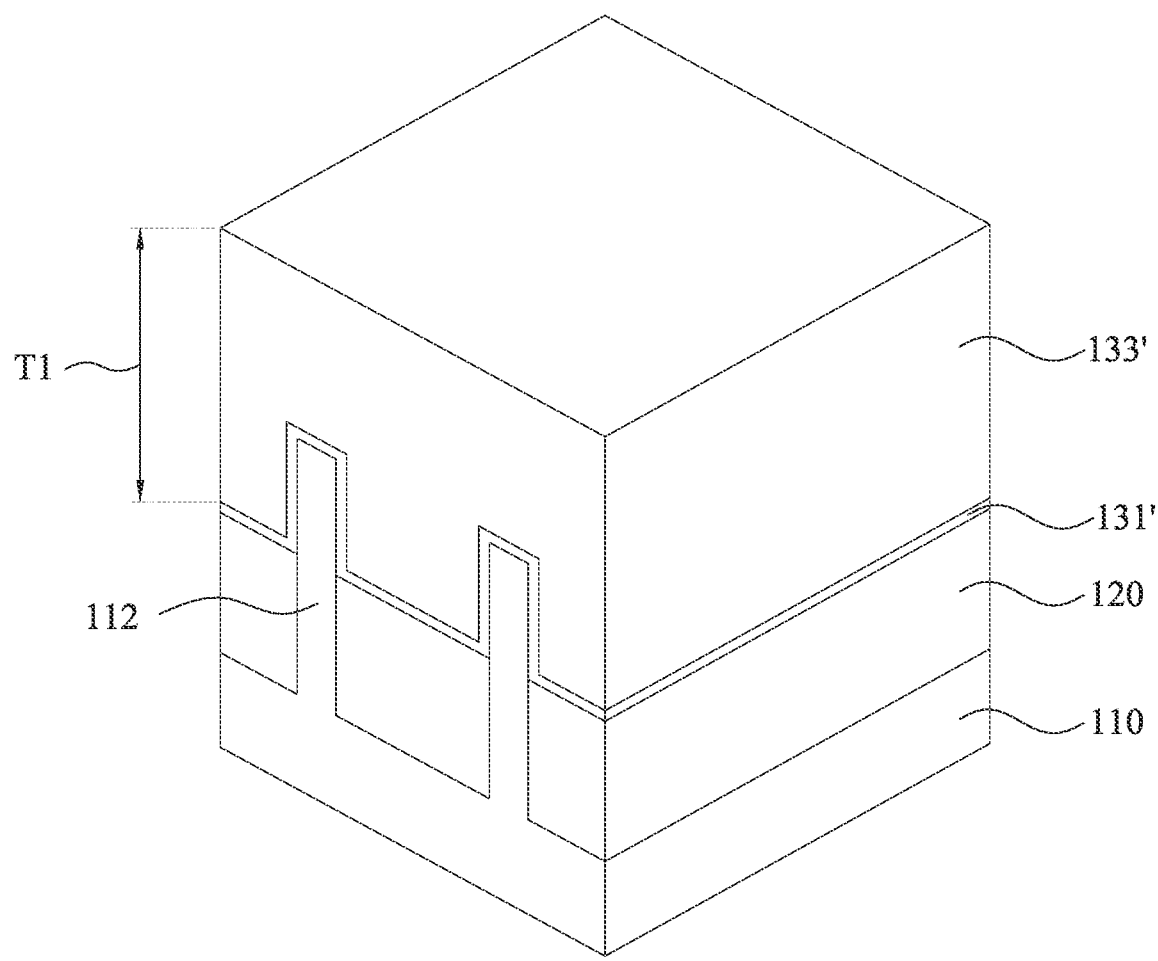
Figure 6:
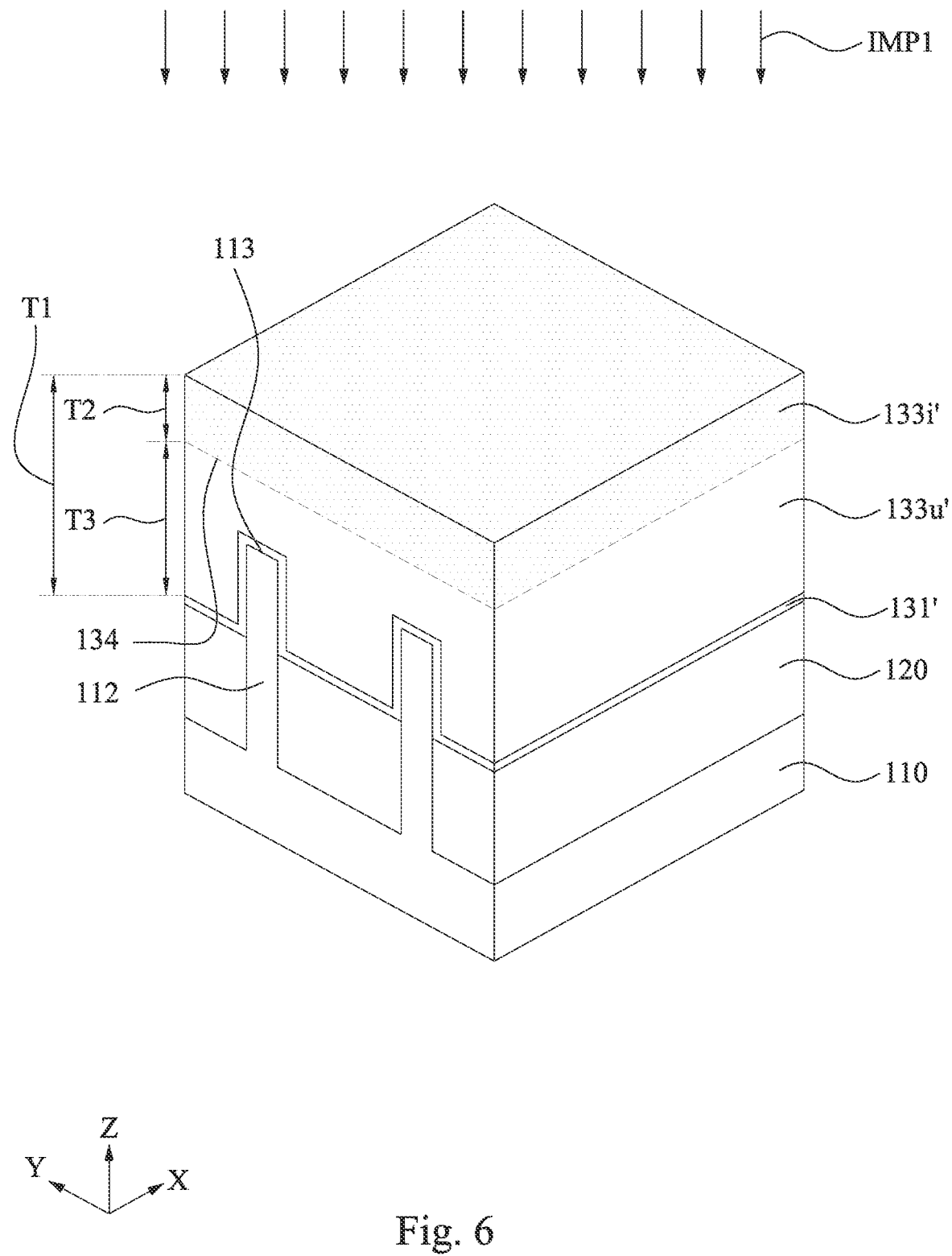

In operation S18 of method Ma in FIG. 1, the dummy gate layer is etched back. For example, as shown in FIG. 5, an etching process is performed to remove a top portion of the dummy gate layer 133' such that the height of the dummy gate layer 133' is reduced (as shown in FIGS. 4 and 5). Therefore, a vertical thickness T1 of the etched-back dummy gate layer 133' is in a range from about 50 nm to about 500 nm. In some embodiments, the etching process may be one or more dry etching process(es), one or more wet etching process(es), or combinations thereof.

In some embodiments, the dummy gate layer 133' include polycrystalline semiconductor and thus has a compressive stress, which may cause huge stress difference between the dummy gate layer 133' and the patterned hard mask stack HM (see FIG. 8) formed thereon. The huge stress difference therebetween would result in distorted dummy gate electrode layers in the patterning process of the dummy gate layer. Therefore, an implantation layer can be formed in the dummy gate layer 133' to release the stress (e.g., from compressive stress toward neutral stress (about 0 stress)) of the dummy gate layer 133', such that the distortion of the dummy gate electrode layers can be improved.

In operation S20 of method Ma in FIG. 1, the dummy gate layer is implanted to form an implantation layer therein. For example, in FIG. 6, an implantation process IMP1 is performed to dope one or more impurities (e.g., dopants) into the dummy gate layer 133'. For example, dopants (e.g., germanium, xenon, argon, silicon, phosphorus, boron, other suitable species that is able to create a more tensile stress than a material of the dummy gate layer 133', or combinations thereof) can be implanted into the dummy gate layer 133', thus forming an implantation region 133i' in the dummy gate layer 133'. Therefore, the implantation region 133i' is formed on the un-implanted dummy gate layer 133u', where a dopant concentration of the implantation region 133i' is greater than a dopant concentration of the un-implanted dummy gate layer 133u'. The implantation process IMP1 transforms the top portion of the dummy gate layer 133' into the amorphous implantation region (or amorphous semiconductor layer) 133i', which has a stress less than the stress of the polycrystalline un-implanted dummy gate layer (or polycrystalline semiconductor layer) 133u'. That is, the amorphous implantation region 133i' is closer to the neutral stress than the polycrystalline un-implanted dummy gate layer 133u'.

In some embodiments, the implantation process IMP1 is performed at a dose of about 1E14 ion/cm$^2$ to about 1E16 ion/cm$^2$, at an energy of about 1 keV to about 50 keV, at a tilt angle from 0 degree to about 60 degrees with respect to a normal line of the top surface of the dummy gate layer 133', and at a temperature from about −100° C. to about 500° C. Dopant concentration and/or dopant depth of the resultant implantation region 133i' depend on the process conditions of the implantation process IMP1. If the process conditions of the implantation process IMP1 are out of the above selected ranges, the dopant concentration and/or dopant depth in the resultant implantation region 133i' may be unsatisfactory for tuning the stress of the implantation region 133i'.

In some embodiments, the implantation region 133i' has a dopant concentration in a range from about 1E19 atoms/cm3 to about 2E22 atoms/cm3, and the un-implanted dummy gate layer 133u' has a substantial zero dopant concentration. If the implantation region 133i' has an excessively high dopant concentration, the stress of the implantation region 133i' may transform from compressive to tensile. If the oxygen-implantation region 133i' has an excessively low dopant concentration, the stress of the implantation region 133i' may be not released effectively. In some embodiments, a vertical thickness T2 of the implantation region 133i' is in a range from about 20% to 50% of the vertical thickness T1 of the dummy gate layer 133'. For example, the vertical thickness T2 is in a range from about 1 nm to about 90 nm. Therefore, a vertical thickness T3 of the un-implanted dummy gate layer 133u' is greater than the vertical thickness T2 of the implantation region 133i' in some embodiments. Further, the implantation region 133i' is spaced apart from the semiconductor fins 112, i.e., a portion of the un-implanted dummy gate layer 133u' is directly between the implantation region 133i' and the semiconductor fins 112. Stated differently, the dummy gate layer 133u' closer to the semiconductor fins 112 is not implanted. Also, a bottom surface 134 of the implantation region 133i is higher than a top surface 113 of the semiconductor fins 112. Hence, the performance of the semiconductor fins 112 would not be affected by the implantation process IMP1.

In operation S22 of method Ma in FIG. 1, a hard mask (HM) stack and a patterned photoresist (PR) layer are formed over the dummy gate layer. For example, in FIG. 7, a hard mask stack HM' is deposited over the implantation region 133i'. The hard mask stack HM' include single or multiple dielectric layers and/or metal layers. For example, the hard mask stack HM' includes a first hard mask 135', a second hard mask 137' over the first hard mask 135', and a third hard mask 139' over the second hard mask 137'. Each of the first hard mask 135', the second hard mask 137', and the third hard mask 139' may be an oxide layer, a nitride layer, or a metal layer. In some embodiments, the first hard mask 135' and the third hard mask 139' are nitride layers, and the second hard mask 137' is an oxide layer, but the present disclosure is not limited thereto.

Figure 7:
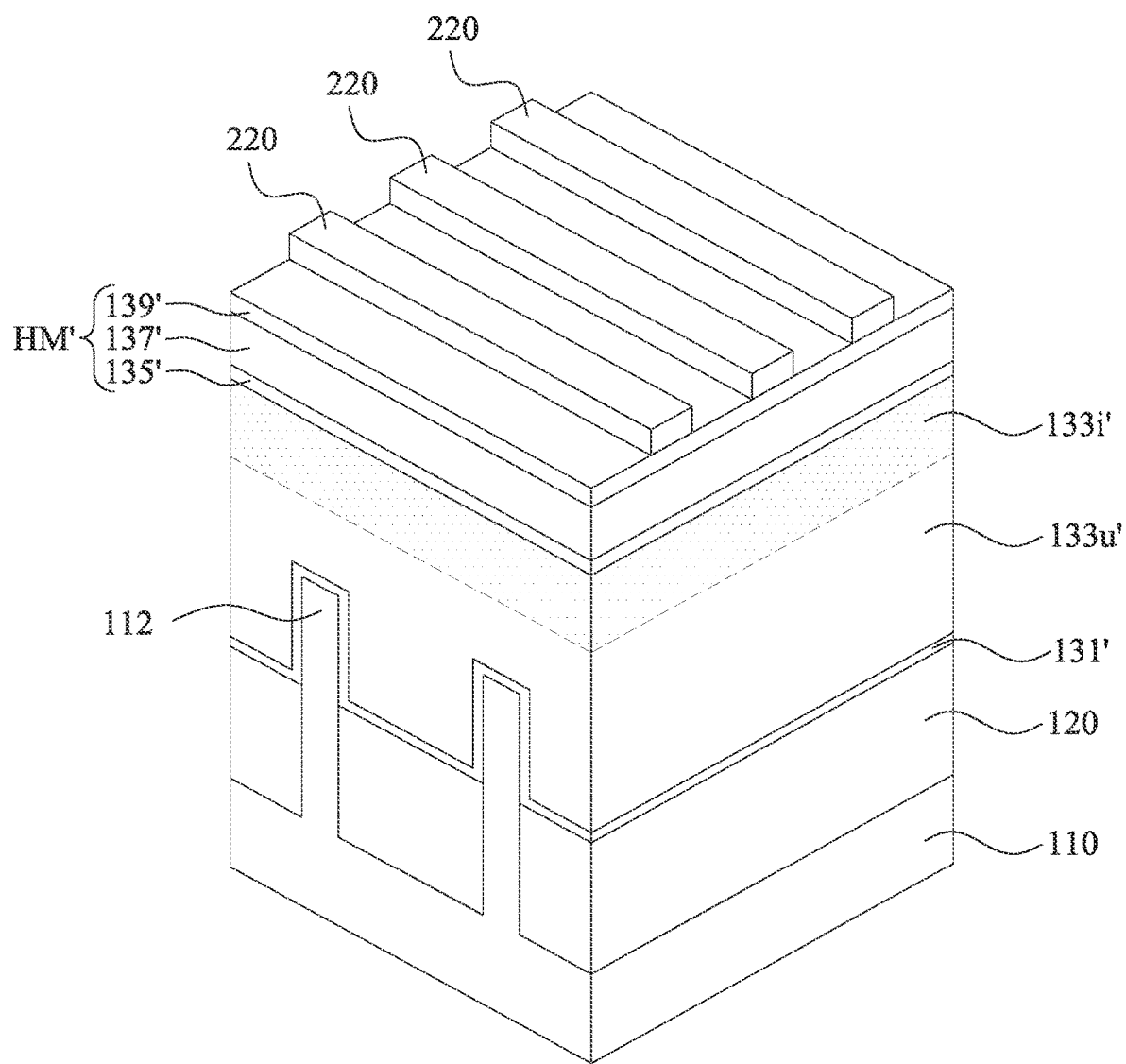
Figure 8:
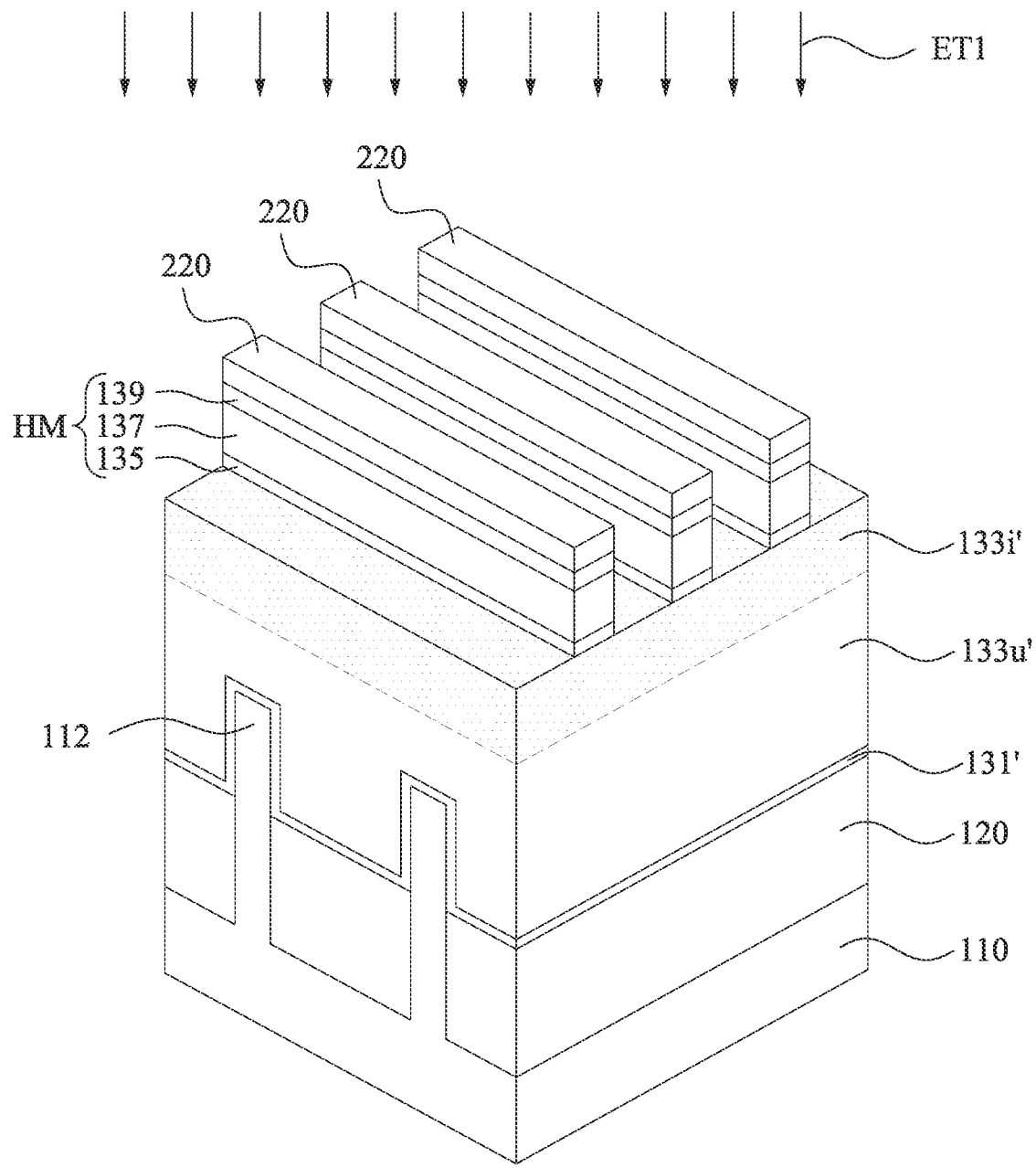
Figure 9:
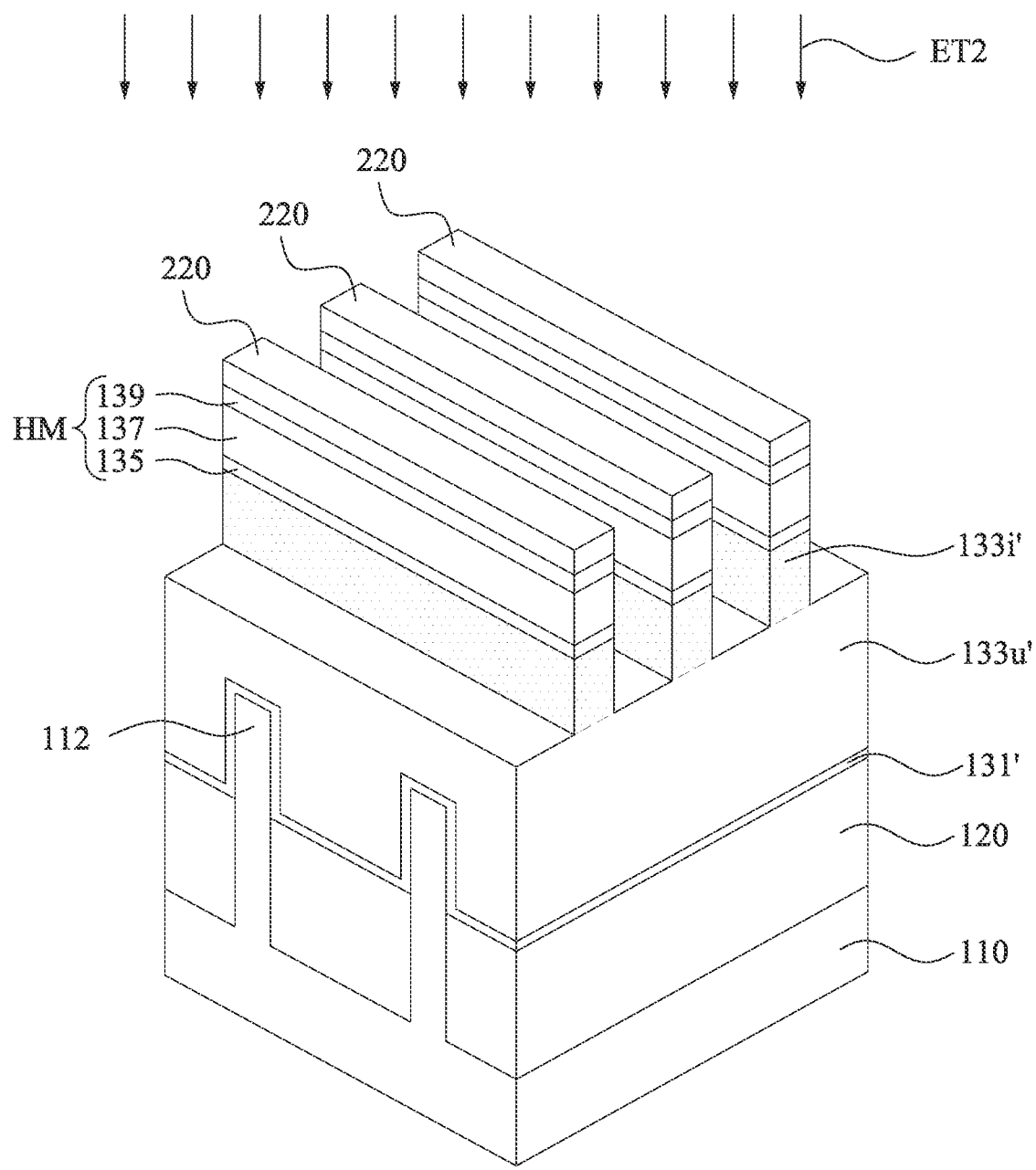
Figure 10:
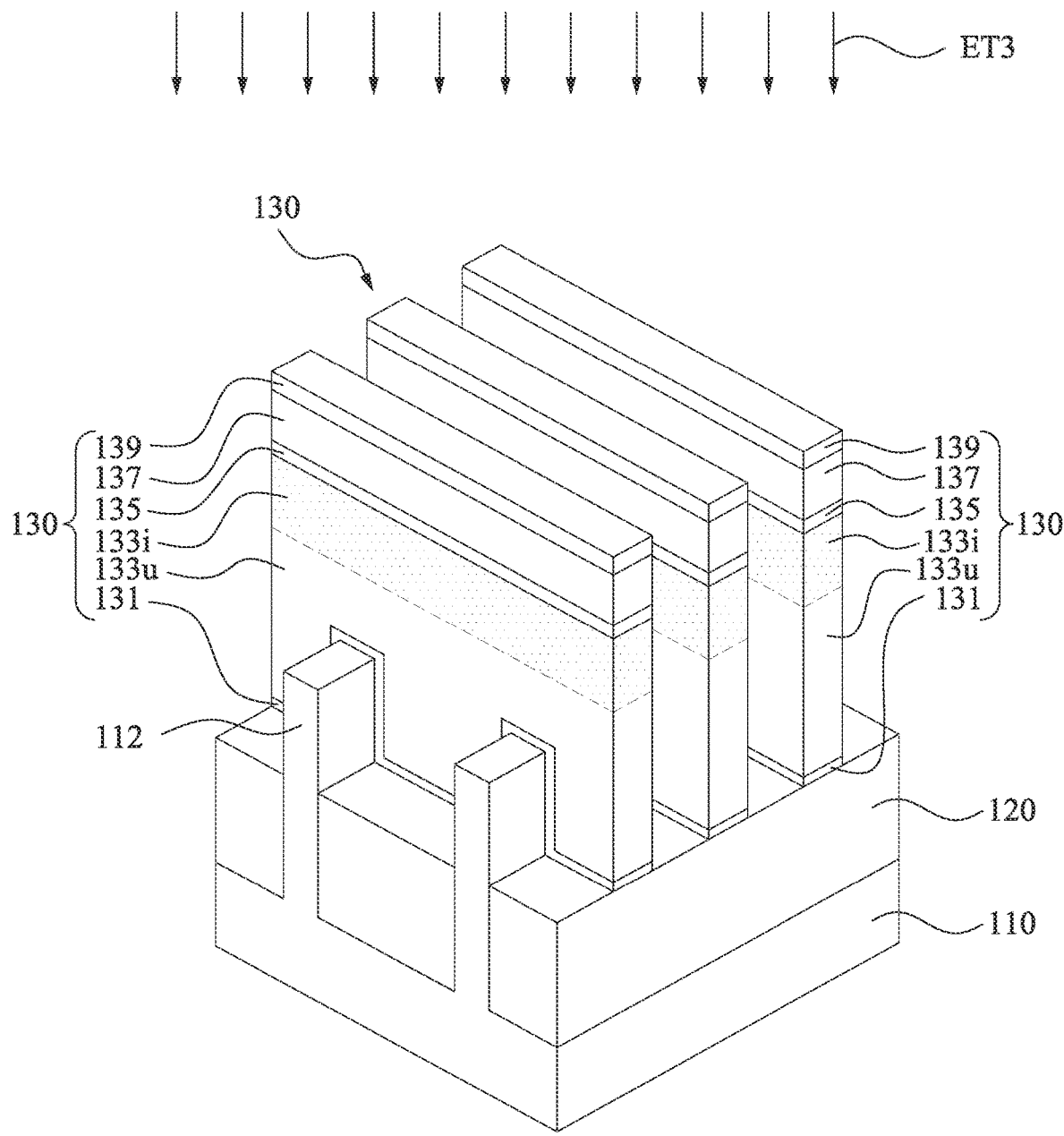

After the formation of the hard mask stack HM', a patterned photoresist layer 220 is formed over the hard mask stack HM'. For example, as shown in FIG. 7, the patterned photoresist layer 220 may be formed by using a double-patterning technique or a single-patterning technique, according to the desired pitch of the resultant dummy gate stacks 130 (see FIG. 10).

In operation S24 of method Ma in FIG. 1, the hard mask stack is patterned. For example, in FIG. 8, one or more first etching process(es) ET1 is performed to pattern the hard mask stack HM' by using the patterned photoresist layers 220 as etching masks. In some embodiments, a first etching operation of the first etching process ET1 is performed to etch the third hard mask 139' and the second hard mask 137' acts as an etch stop layer for etching the third hard mask 139'. Similarly, a second etching operation of the first etching process ET1 is then performed to etch the second hard mask 137' and the first hard mask 135' acts as an etch stop layer for etching the second hard mask 137', and a third etching operation of the first etching process ET1 is subsequently performed to etch the first hard mask 135' and the implantation region 133i' acts as an etch stop layer for etching the first hard mask 135'. The first etching process ET1 forms the patterned hard mask stacks HM, each of which includes a first hard mask 135, a second hard mask 137 over the first hard mask 135, and a third hard mask 139 over the second hard mask 137.

In operation S26 of method Ma in FIG. 1, the dummy gate layer is patterned to form dummy gate structures. For example, in FIGS. 9-10, a second etching process ET2 is performed to etch the implantation region 133i' by using the patterned hard mask stack HM as an etch mask and a third etching process ET3 is then performed to etch the un-implanted dummy gate layer 133u' and the dummy dielectric layer 131' by using the etched implantation region as an etch mask. Since the implantation region 133i' and the un-implanted dummy gate layer 133u' have different atomic structures (i.e., amorphous versus polycrystalline), the etching rates thereof may be slightly different under the same etchant or etching gas, resulting in different critical dimensions in the implantation region 133i' and the un-implanted dummy gate layer 133u'. Therefore, the recipe of the second etching process ET2 may be different from that of the third etching process ET3 to modify the critical dimensions. For example, the second etching process ET2 and the third etching process ET3 are both plasma etching processes but with different bias power and/or different flow rates of the etching gas. The bias power of the second etching process ET2 may be lower than the bias power of the third etching process ET3, and/or the flow rate of the etching gas (e.g., halogen based gas) used in the second etching process ET2 may be lower than flow rate of the etching gas (e.g., halogen based gas used in the third etching process ET3. The second etching process ET2 and the third etching process ET3 may be performed continuously.

After the preformation of the third etching process ET3, dummy gate structures 130 are formed over the substrate 110. Each of the dummy gate structures 130 includes the dummy dielectric layer 131, the (un-implanted) dummy gate electrode layer 133$u$, the implantation region 133$i$, the first hard mask 135, the second hard mask 137, and the third hard mask 139.

As mentioned above, the implantation region 133$i'$ has a stress closer to the neutral stress than the stress of the un-implanted dummy gate layer 133$u'$, such that the stress difference between the implantation region 133$i'$ and the hard mask stack HM is reduced. Hence, the distortion in the implantation region 133$i'$ (and in the hard mask stack HM) during the second etching process ET2 can be improved. In some embodiments, the line width variation of each of the dummy gate structures 130 is less than about 1.8 nm.

Figure 11:
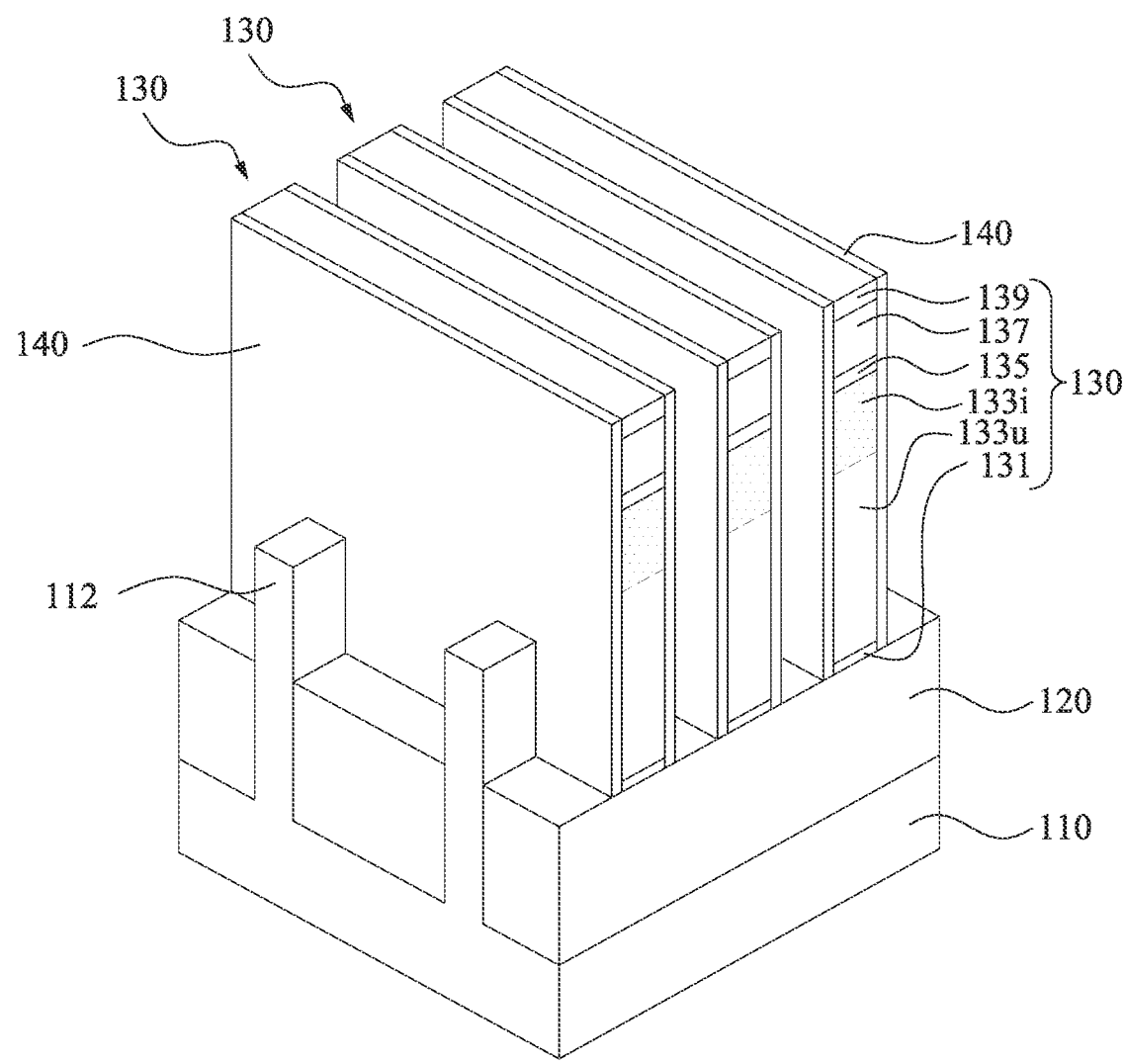

In operation S28 of method Ma in FIG. 1, a spacer structure is formed over the substrate to surround the dummy gate structure. As shown in FIG. 11, after formation of the dummy gate structures 130 is completed, a spacer structure 140 is formed on sidewalls of the dummy gate structures 130 to surround the dummy gate structures 130. That is, the spacer structure 140 is in contact with the implantation region 133$i$ and the un-implanted dummy gate layer 133$u$. In some embodiments of the gate spacer formation operations, a spacer material layer is deposited on the substrate 110. The spacer material layer may be a conformal layer that is subsequently etched back to form the spacer structure 140. In some embodiments, the spacer material layer includes multiple layers, such as a first spacer layer and a second spacer layer formed over the first spacer layer. The first and second spacer layers each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers may be formed by depositing in sequence two different dielectric materials over the dummy gate structures 130 using processes such as, an ALD process, a PEALD (plasma enhanced ALD) process, a PECVD process, a subatmospheric CVD (SACVD) process, or other suitable process. An anisotropic etching process is then performed on the deposited spacer layers to expose portions of the semiconductor fins 112 not covered by the dummy gate structures 130 (e.g., in the source/drain regions of the semiconductor fins 112). Portions of the spacer layers directly above the dummy gate structures 130 may be removed by this anisotropic etching process. Portions of the spacer layers on sidewalls of the dummy gate structures 130 may remain, forming gate sidewall spacers, which are denoted as the spacer structures 140, for the sake of simplicity. In some embodiments, the first spacer layer is formed of silicon oxide that has a lower dielectric constant than silicon nitride, and the second spacer layer is formed of silicon nitride that has a higher etch resistance against subsequent etching processing (e.g., etching source/drain recesses in the semiconductor fins 112) than silicon oxide. In some embodiments, the spacer structure 140 may be used to offset subsequently formed doped regions, such as source/drain regions. The spacer structure 140 may further be used for designing or modifying the source/drain region profile.

In operation S30 of method Ma in FIG. 1, source/drain epitaxial structures are formed over the semiconductor fin. For example, in FIG. 12, after the formation of the spacer structure 140 is completed, source/drain epitaxial structures 150 are formed on source/drain regions of the semiconductor fins 112 that are not covered by the dummy gate structures 130 and the spacer structures 140. In some embodiments, formation of the source/drain epitaxial structures 150 includes recessing source/drain regions of the semiconductor fins 112, followed by epitaxially growing semiconductor materials in the recessed source/drain regions of the semiconductor fins 112.

The source/drain regions of the semiconductor fins 112 can be recessed using suitable selective etching processing that attacks the semiconductor fins 112, but barely attacks the spacer structures 140 and the third hard masks 139 of the dummy gate structures 130. For example, recessing the semiconductor fins 112 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 112 at a faster etch rate than it etches the spacer structures 140 and the third hard masks 139 of the dummy gate structures 130. In some other embodiments, recessing the semiconductor fin 112 may be performed by a wet chemical etch, such as ammonium peroxide mixture (APM), NH$_4$OH, tetramethylammonium hydroxide (TMAH), combinations thereof, or the like, which etches the semiconductor fins 112 at a faster etch rate than it etches the spacer structures 140 and the third hard masks 139 of the dummy gate structures 130. In some other embodiments, recessing the semiconductor fins 112 may be performed by a combination of a dry chemical etch and a wet chemical etch.

Once recesses are created in the source/drain regions of the semiconductor fins 112, the source/drain epitaxial structures 150 are formed in the source/drain recesses in the semiconductor fins 112 by using one or more epitaxy or epitaxial (epi) processes that provides one or more epitaxial materials on the semiconductor fins 112. During the epitaxial growth process, the spacer structures 140 limit the one or more epitaxial materials to source/drain regions in the semiconductor fins 112. In some embodiments, the lattice constants of the source/drain epitaxial structures 150 are different from the lattice constant of the semiconductor fins 112, so that the channel region in the semiconductor fins 112 and between the source/drain epitaxial structures 150 can be strained or stressed by the source/drain epitaxial structures 150 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112.

In some embodiments, the source/drain epitaxial structures 150 include Ge, Si, GaAs, AlGaAs, SiGe, GaAsP, SiP, or other suitable material. The source/drain epitaxial structures 150 may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 150 are not in-situ doped, an implantation process (i.e., a junction implant process) is performed to dope the source/drain epitaxial structures 150. In some exemplary embodiments, the source/drain epitaxial structures 150 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed semiconductor fins 112 in the p-type device regions. The mask may then be removed. Subsequently, a mask, such as a photoresist, may be formed over the p-type device region while exposing the n-type device regions, and n-type epitaxial structures may be formed on the exposed semiconductor fins 112 in the n-type device region. The mask may then be removed.

Once the source/drain epitaxial structures 150 are formed, an annealing process can be performed to activate the p-type dopants or n-type dopants in the source/drain epitaxial structures 150. The annealing process may be, for example, a rapid thermal anneal (RTA), a laser anneal, a millisecond thermal annealing (MSA) process or the like.

Figure 13:
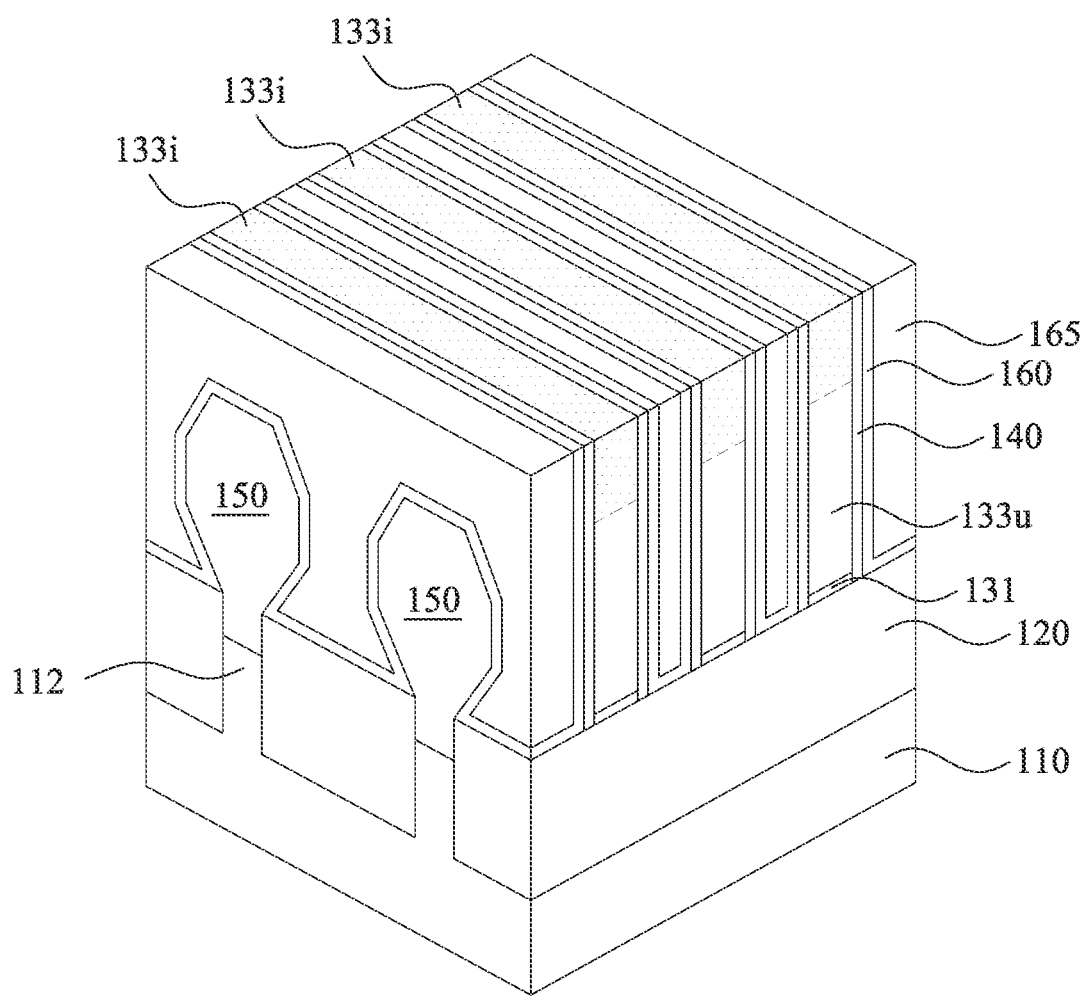

In operation S32 of method Ma in FIG. 1, the dummy gate structure is replaced with a metal gate structure. For example, as shown in FIG. 13, an interlayer dielectric (ILD) layer 165 is formed on the substrate 110. In some embodiments, a contact etch stop layer (CESL) 160 is also formed prior to forming the ILD layer 165. In some embodiments, the CESL 160 includes a silicon nitride layer, a silicon oxynitride layer, and/or other suitable materials having a different etch selectivity than the ILD layer 165. The CESL 160 may be formed by plasma-enhanced chemical vapor deposition (PECVD) process and/or other suitable deposition or oxidation processes. In some embodiments, the ILD layer 165 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 160. The ILD layer 165 may be deposited by a subatmospheric CVD (SACVD) process, a flowable CVD process, or other suitable deposition technique. In some embodiments, after formation of the ILD layer 165, the wafer may be subject to a high thermal budget process to anneal the ILD layer 165.

Figure 12:
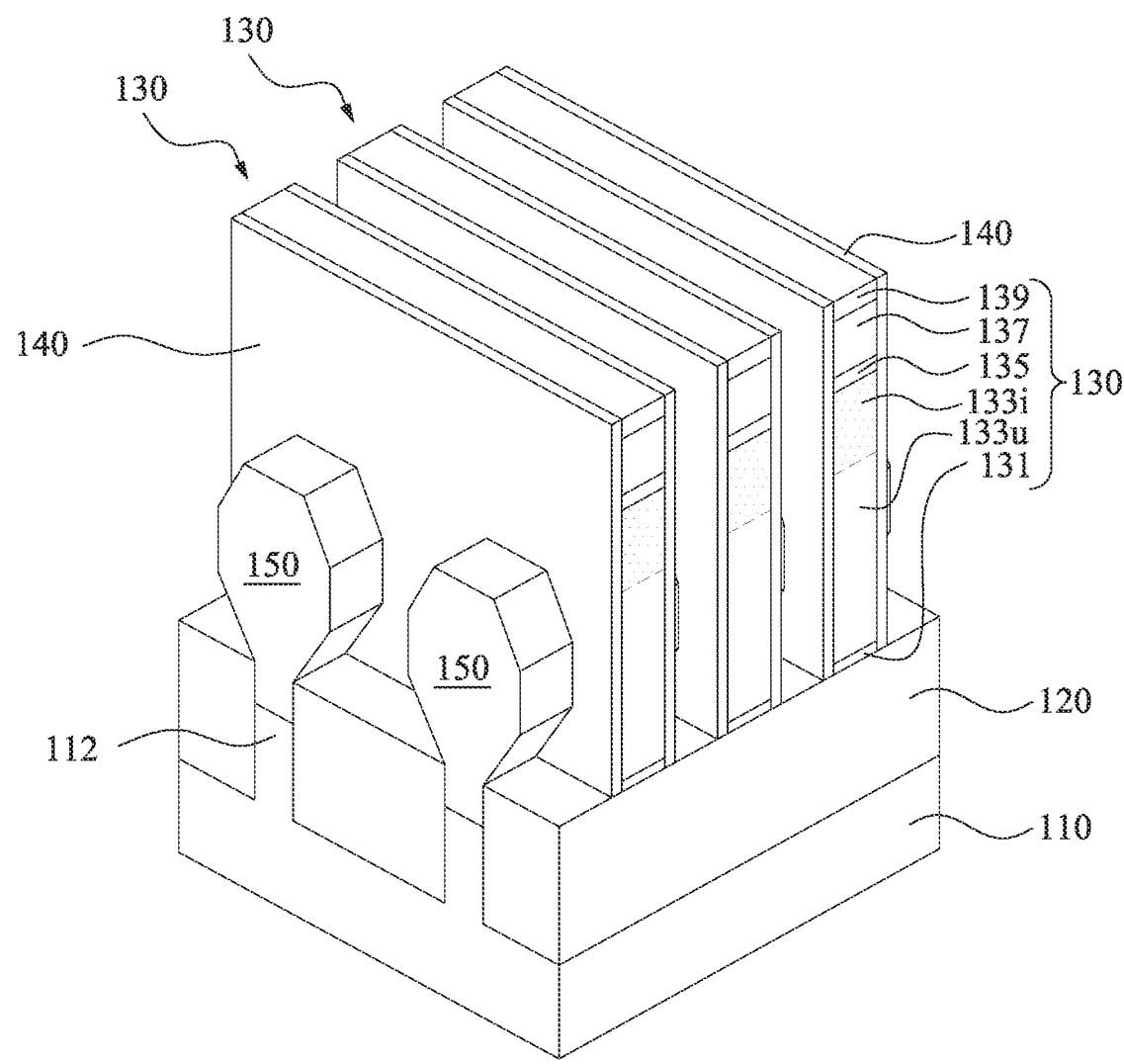

In some examples, after forming the ILD layer 165, a planarization process may be performed to remove excessive materials of the ILD layer 165. For example, a planarization process includes a chemical mechanical planarization (CMP) process which removes portions of the ILD layer 165 (and the CESL 160, if present) overlying the dummy gate structures 130. In some embodiments, the CMP process also removes the hard masks 135, 137, and 139 (as shown in FIG. 12) and exposes the implantation region 133i.

Figure 14:
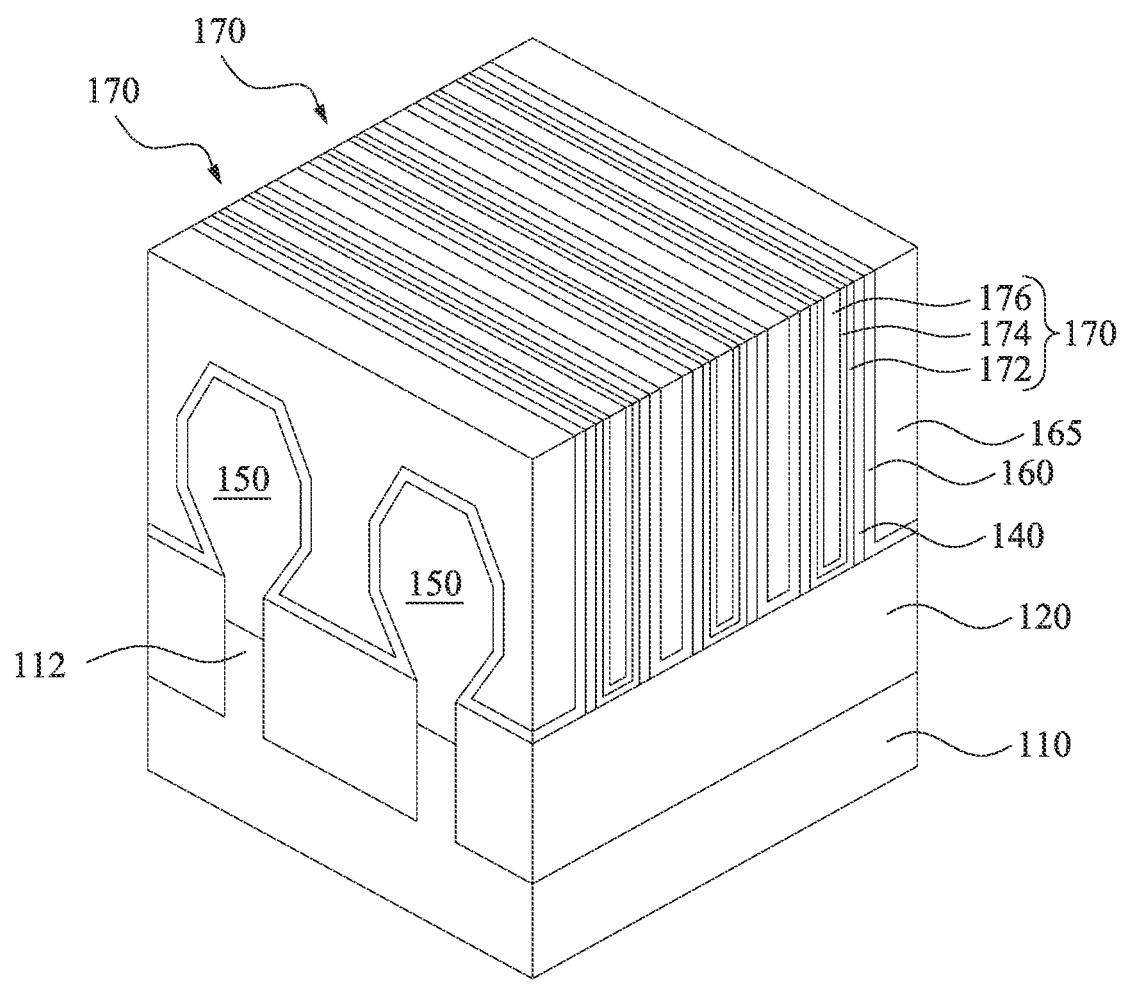
Figure 15:
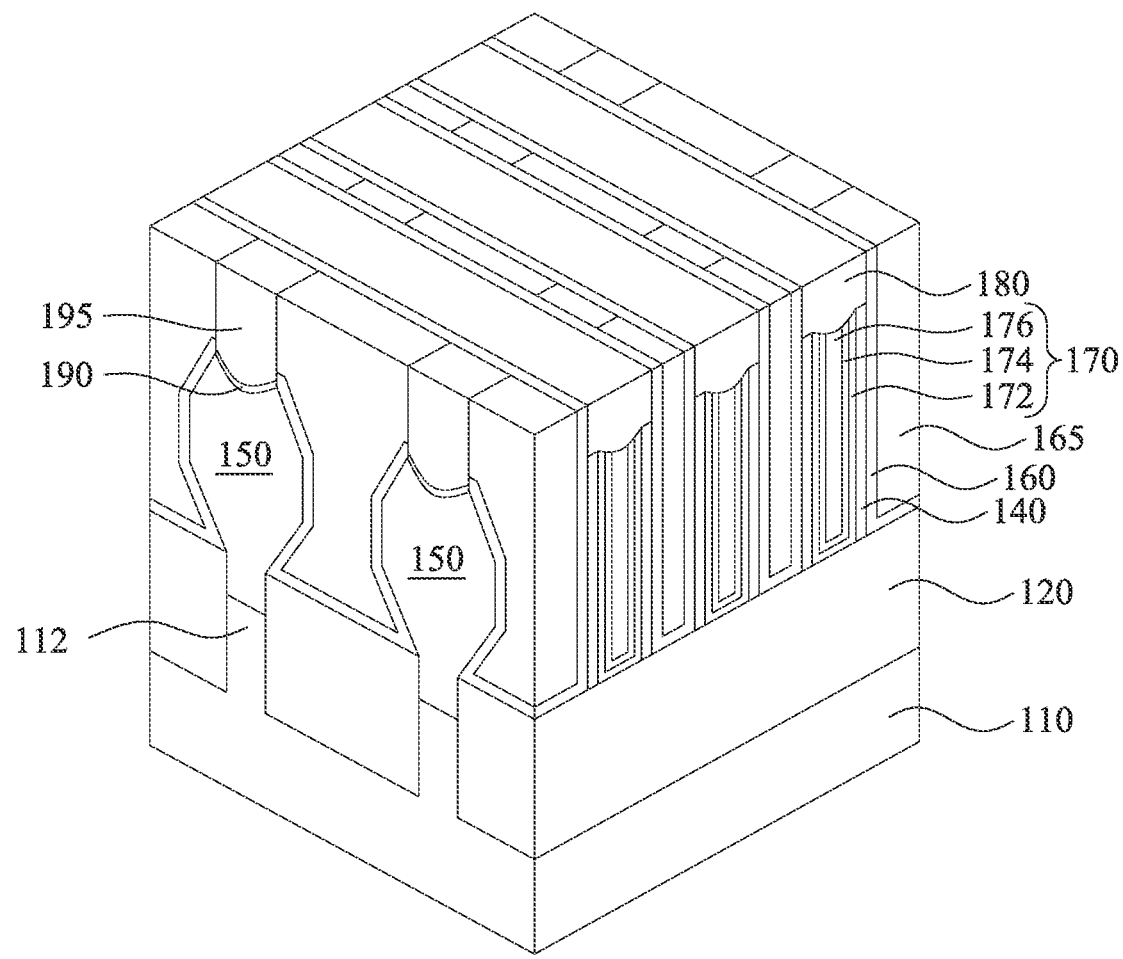
Figure 15:
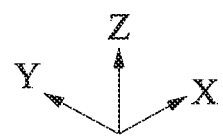

Reference is made to FIG. 14. The implantation regions 133i, the dummy gate electrode layers 133u and the dummy gate dielectric layers 131 (see FIG. 13) are removed, resulting in gate trenches between corresponding spacer structures 140. The implantation regions 133i, the dummy gate electrode layers 133u and the dummy gate dielectric layers 131 are removed using a selective etching process (e.g., selective dry etching, selective wet etching, or combinations thereof) that etches materials in the implantation regions 133i, the dummy gate electrode layers 133u and the dummy gate dielectric layers 131 at a faster etch rate than it etches other materials (e.g., the spacer structures 140, the CESL 160, and/or the ILD layer 165).

Thereafter, replacement gate structures 170 are respectively formed in the gate trenches. The gate structures 170 may be the final gates of FinFETs. The final gate structures each may be a high-k/metal gate stack, however other compositions are possible. In some embodiments, each of the gate structures 170 forms the gate associated with the three-sides of the channel region provided by the semiconductor fins 112. Stated another way, each of the gate structures 170 wraps around the semiconductor fins 112 on three sides. In various embodiments, the (high-k/metal) gate structure 170 includes a gate dielectric layer 172 lining the gate trench and a gate electrode over the gate dielectric layer 172. The gate electrode may include a work function metal layer 174 formed over the gate dielectric layer 172 and a fill metal 176 formed over the work function metal layer 174 and filling a remainder of gate trenches. The gate dielectric layer 172 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 174 and/or fill metal 176 used within high-k/metal gate structures 170 may include a metal, metal alloy, or metal silicide. Formation of the high-k/metal gate structures 170 may include multiple deposition processes to form various gate materials, one or more liner layers, and one or more CMP processes to remove excessive gate materials.

In some embodiments, the interfacial layer of the gate dielectric layer 172 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 172 may include hafnium oxide ($HfO_2$). Alternatively, the gate dielectric layer 172 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 174 may include work function metals to provide a suitable work function for the high-k/metal gate structures 170. For an n-type FinFET, the work function metal layer 174 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 174 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 176 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

In operation S34 of method Ma in FIG. 1, source/drain contacts are formed above the source/drain epitaxial structures. For example, in FIG. 15, optionally, an etching back process is performed to etch back the replacement gate structures 170 and the spacer structures 140, resulting in recesses over the etched-back gate structures 170 and the etched-back spacer structures 140. In some embodiments, because the materials of the replacement gate structures 170 have a different etch selectivity than the spacer structures 140, a first selective etching process may be initially performed to etch back the replacement gate structures 170 to lower the replacement gate structures 170. Subsequently, a second selective etching process is performed to lower the spacer structures 140. As a result, the top surfaces of the replacement gate structures 170 may be at a different level than the top surfaces of the spacer structures 140.

Subsequently, dielectric caps 180 are respectively formed in the recesses. For example, a dielectric cap layer is deposited over the substrate 110 until the recesses are overfilled. The dielectric cap layer includes SiN, SiC, SiCN, SiON, SiCON, combinations thereof or the like, and is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the cap layer outside the recesses, leaving portions of the dielectric cap layer in the recesses to serve as the dielectric caps 180.

Source/drain contacts 195 are formed extending through the ILD layer 165. Formation of the source/drain contacts 195 includes, by way of example and not limitation, performing one or more etching processes to form contact openings extending though the ILD layer 165 to expose the source/drain epitaxial structures 150, depositing one or more metal materials overfilling the contact openings, and then performing a CMP process to remove excessive metal materials outside the contact openings. In some embodiments, the one or more etching processes are selective etching that etches the ILD layer 165 at a faster etch rate than etching the dielectric caps 180 and the CESL 160. As a result, the selective etching is performed using the dielectric caps 180 and the CESL 160 as an etch mask, such that the contact openings and hence source/drain contacts 195 are formed self-aligned to the source/drain epitaxial structures 150 without using an additional photolithography process. In that case, the dielectric caps 180 allowing for forming the source/drain contacts 195 in a self-aligned manner can be called self-aligned-contact (SAC) caps 180.

In some embodiments, metal alloy layers 190 are respectively formed above the source/drain epitaxial structures 150 prior to forming the source/drain contacts 195. The frontside metal alloy layers 190, which may be silicide layers, are respectively formed in the trenches and over the exposed source/drain epitaxial structures 150 by a self-aligned silicide (salicide) process. The silicide process converts the surface portions of the source/drain epitaxial structures 150 into the silicide contacts. Silicide processing involves deposition of a metal that undergoes a silicidation reaction with silicon (Si). In order to form silicide contacts on the source/drain epitaxial structures 150, a metal material is blanket deposited on the source/drain epitaxial structures 150. After heating the wafer to a temperature at which the metal reacts with the silicon of the source/drain epitaxial structures 150 to form contacts, unreacted metal is removed. The silicide contacts remain over the source/drain epitaxial structures 150, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 190 may include germanium.

As mentioned above, since the implantation region 133i' (see FIG. 6) improves the distortion of the dummy gate structures 130, the following formed metal gate structures 170, which inherit the profile of the dummy gate structures 130, have small line width variations. That is, the sidewalls of the gate structures 170 have low surface roughness, i.e., the gate structures 170 are straight in a top view. Therefore, the short issue between the gate structures 170 and the source/drain contacts 195 can be improved.

Figure 16:
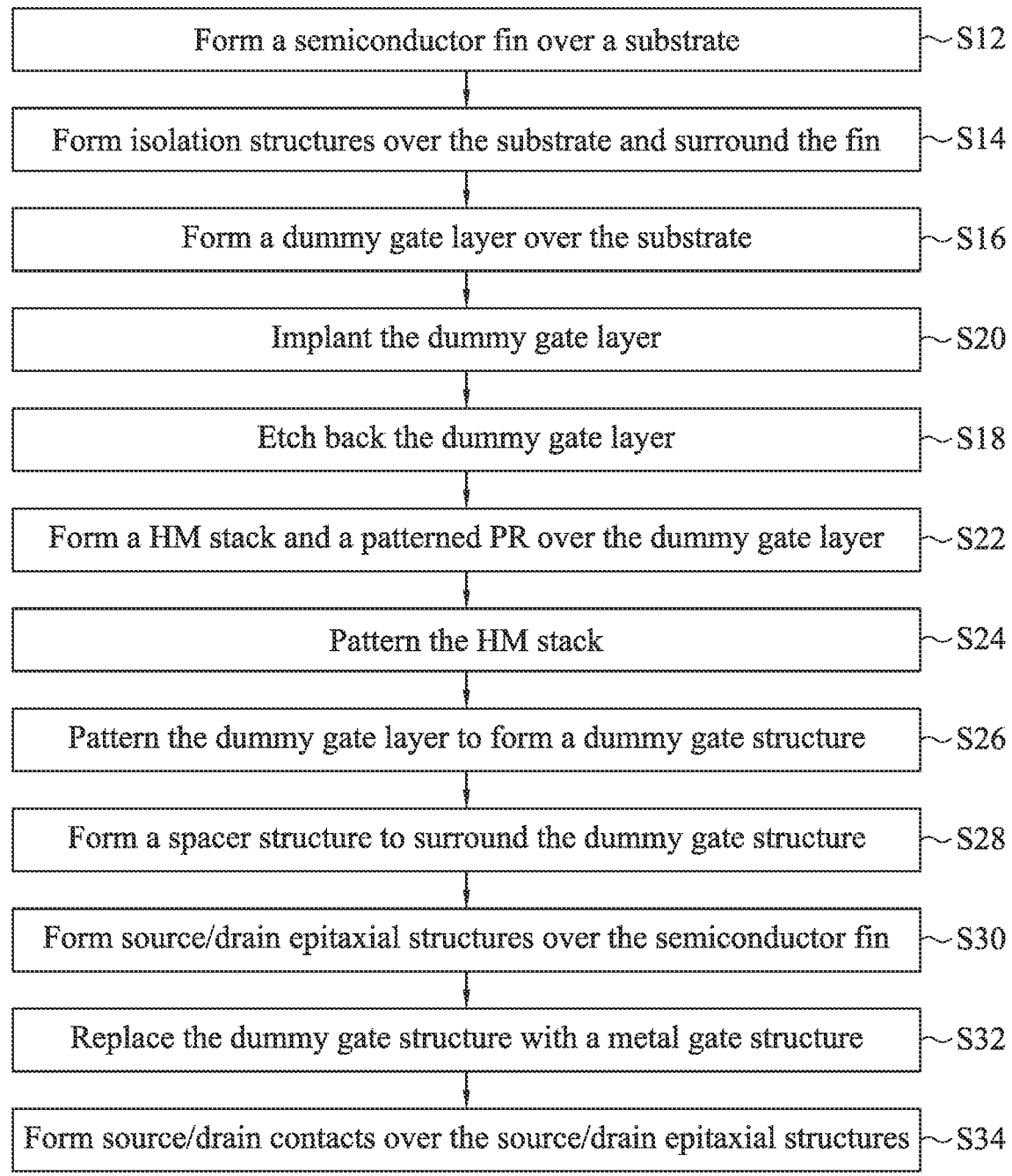
FIG. 16 is a flowchart of a method for making a semiconductor device (or an integrated circuit structure) according to aspects of the present disclosure in various embodiments.

FIG. 16 is a flowchart of a method Mb for making a semiconductor device (or an integrated circuit structure) according to aspects of the present disclosure in various embodiments. Throughout the various views and illustrative embodiments, like reference numbers are used to designate like elements. The present embodiment may repeat reference numerals and/or letters used in FIGS. 2-15. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 17-18, which illustrate a method for manufacturing the semiconductor device at various stages in accordance with some embodiments of the present disclosure.

In operation S12 of method Mb in FIG. 16, a semiconductor fin is formed over a substrate. In operation S14 of method Mb in FIG. 16, isolation structures are formed over the substrate and surround the semiconductor fin. In operation S16 of method Mb in FIG. 16, a dummy gate layer is formed over the substrate. The details in operations S12, S14, and S16 are described above as shown in FIGS. 2-4, and, therefore, a description in this regard will not be repeated hereinafter.

In operation S20 of method Mb in FIG. 16, the dummy gate layer is implanted to form an implantation layer therein. For example, in FIG. 17, after the CMP process is performed to the dummy gate layer 130' as shown in FIG. 4, an implantation process IMP2 is performed to dope one or more impurities (e.g., dopants) into the dummy gate layer 133'. The details of the implantation process IMP2 are similar to that of the implantation process IMP1 mentioned above except the dosage and/or the energy used therein. For example, the energy used in the implantation process IMP2 is greater than the energy used in the implantation process IMP1 to dope the impurities into the predetermined depth.

Figure 17:
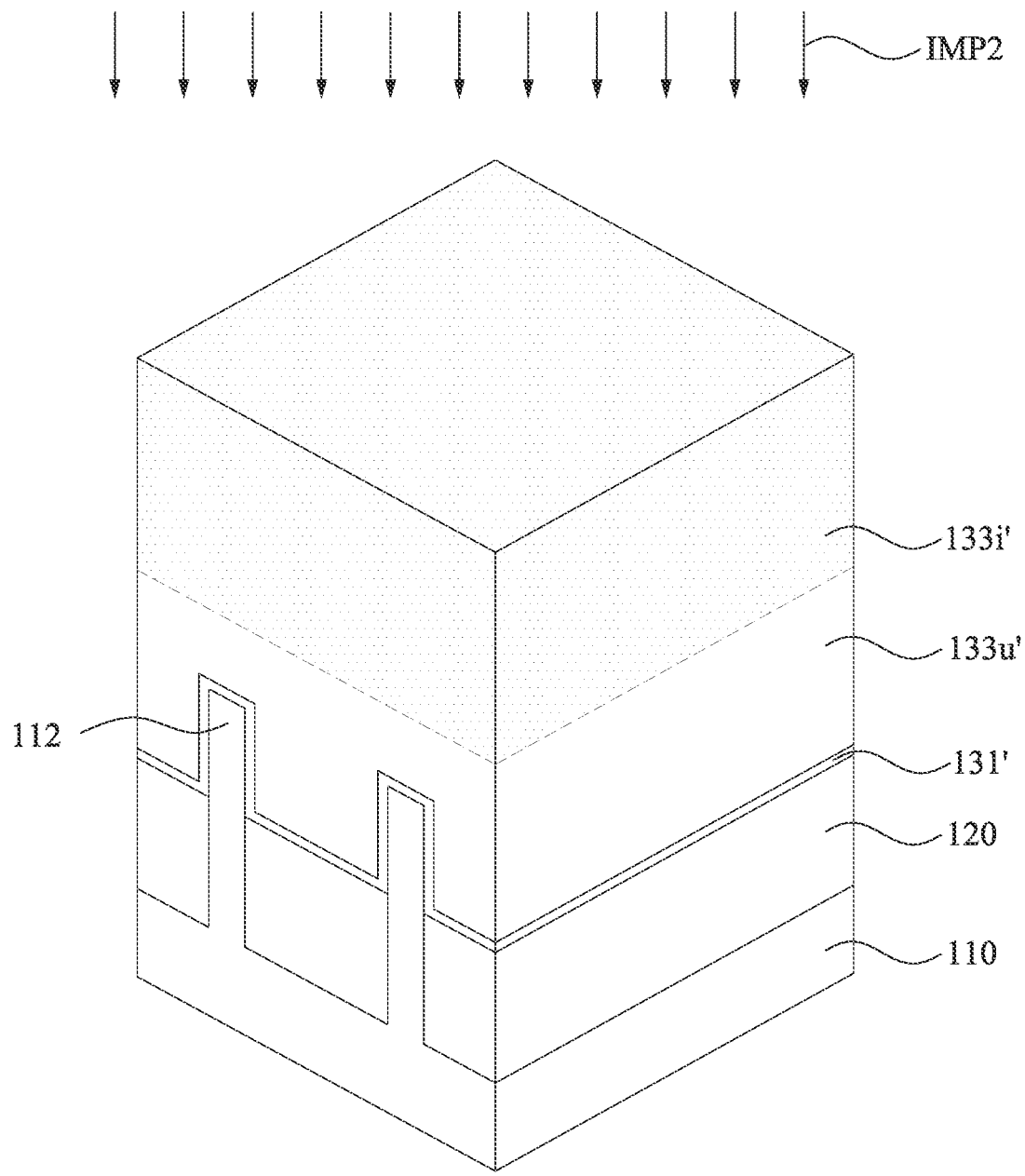
FIGS. 17-18 illustrate a method for manufacturing the semiconductor device at various stages in accordance with some embodiments of the present disclosure.
Figure 18:
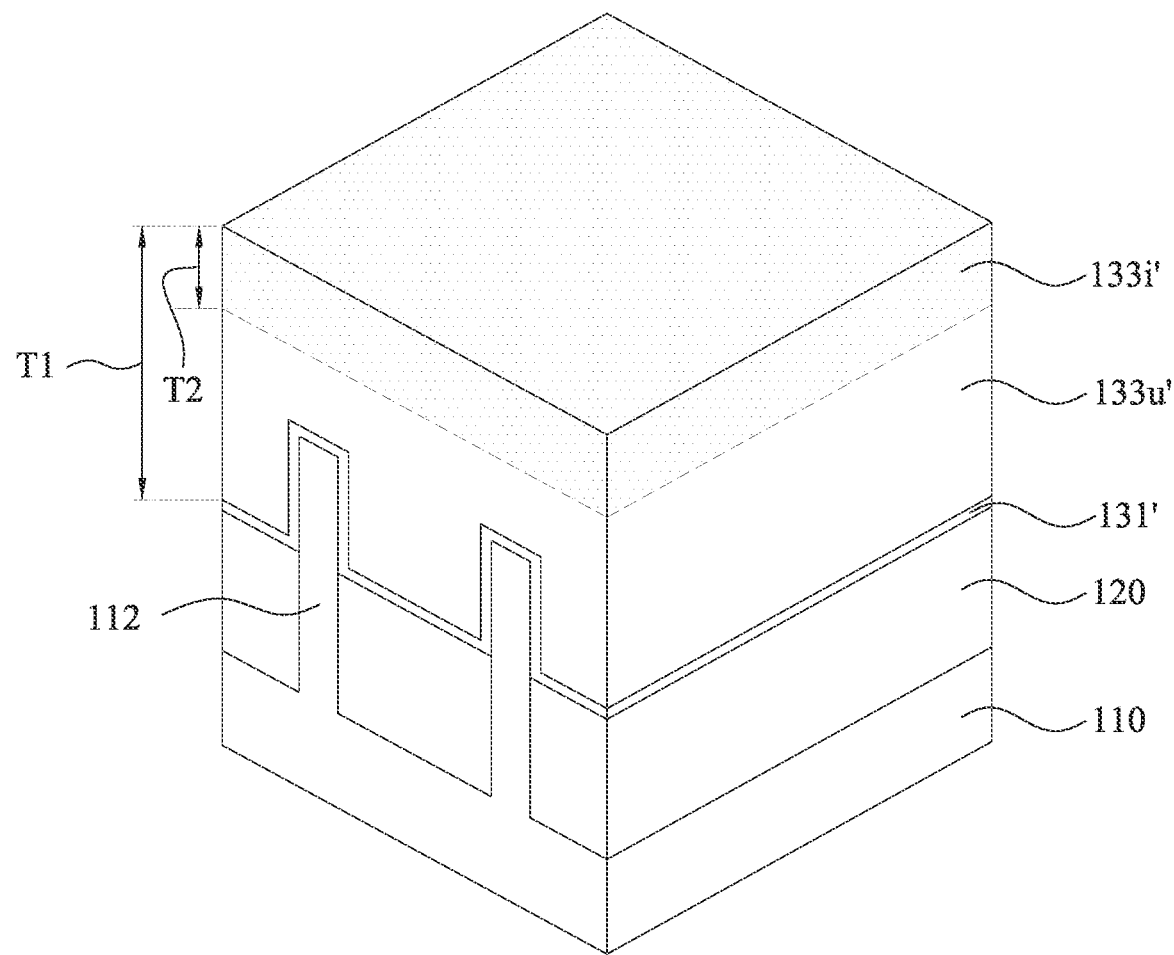

In operation S18 of method Mb in FIG. 16, the dummy gate layer is etched back. As shown in FIGS. 17 and 18, since the implantation process IMP2 is performed before the etching back process, the top portion of the implantation region 133i' is removed. However, the resultant implantation region 133i' still has a vertical thickness T2 in a range from about 20% to about 50% of the vertical thickness T1.

After the operation S18, plural processes are performed. In operation S22 of method Mb in FIG. 16, a HM stack and a patterned PR layer are formed over the dummy gate layer. In operation S24 of method Mb in FIG. 16, the hard mask stack is patterned. In operation S26 of method Mb in FIG. 16, the dummy gate layer is patterned to form dummy gate structures. In operation S28 of method Mb in FIG. 16, a spacer structure is formed over the substrate to surround the dummy gate structure. In operation S30 of method Mb in FIG. 16, source/drain epitaxial structures are formed over the semiconductor fin. In operation S32 of method Mb in FIG. 16, the dummy gate structure is replaced with a metal gate structure. In operation S34 of method Mb in FIG. 16, source/drain contacts are formed above the source/drain epitaxial structures. The details in operations S22, S24, S26, S28, S30, S32, and S34 are described above as shown in FIGS. 7-15, and, therefore, a description in this regard will not be repeated hereinafter.

Figure 19:
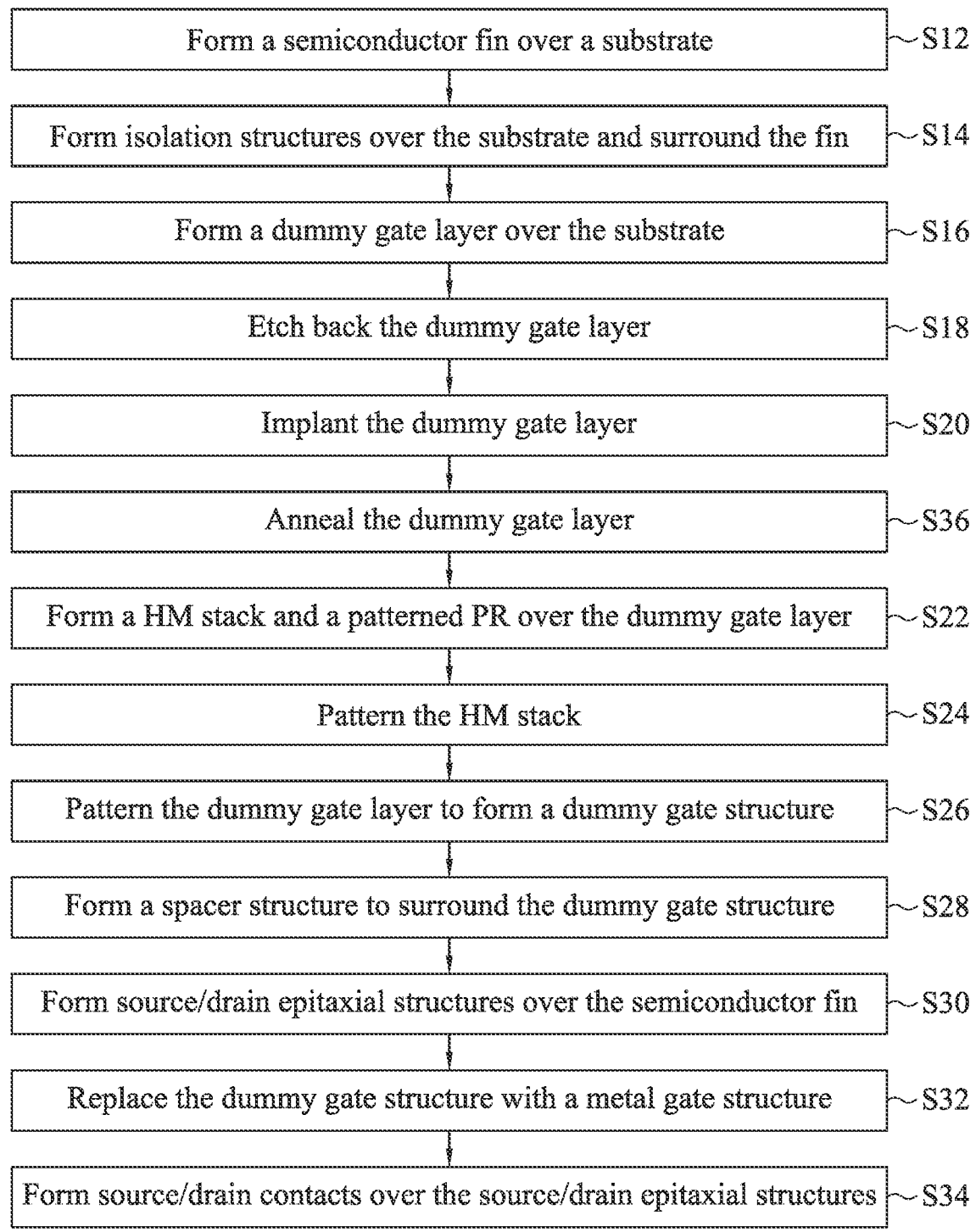
FIG. 19 is a flowchart of a method for making a semiconductor device (or an integrated circuit structure) according to aspects of the present disclosure in various embodiments.
Figure 20:
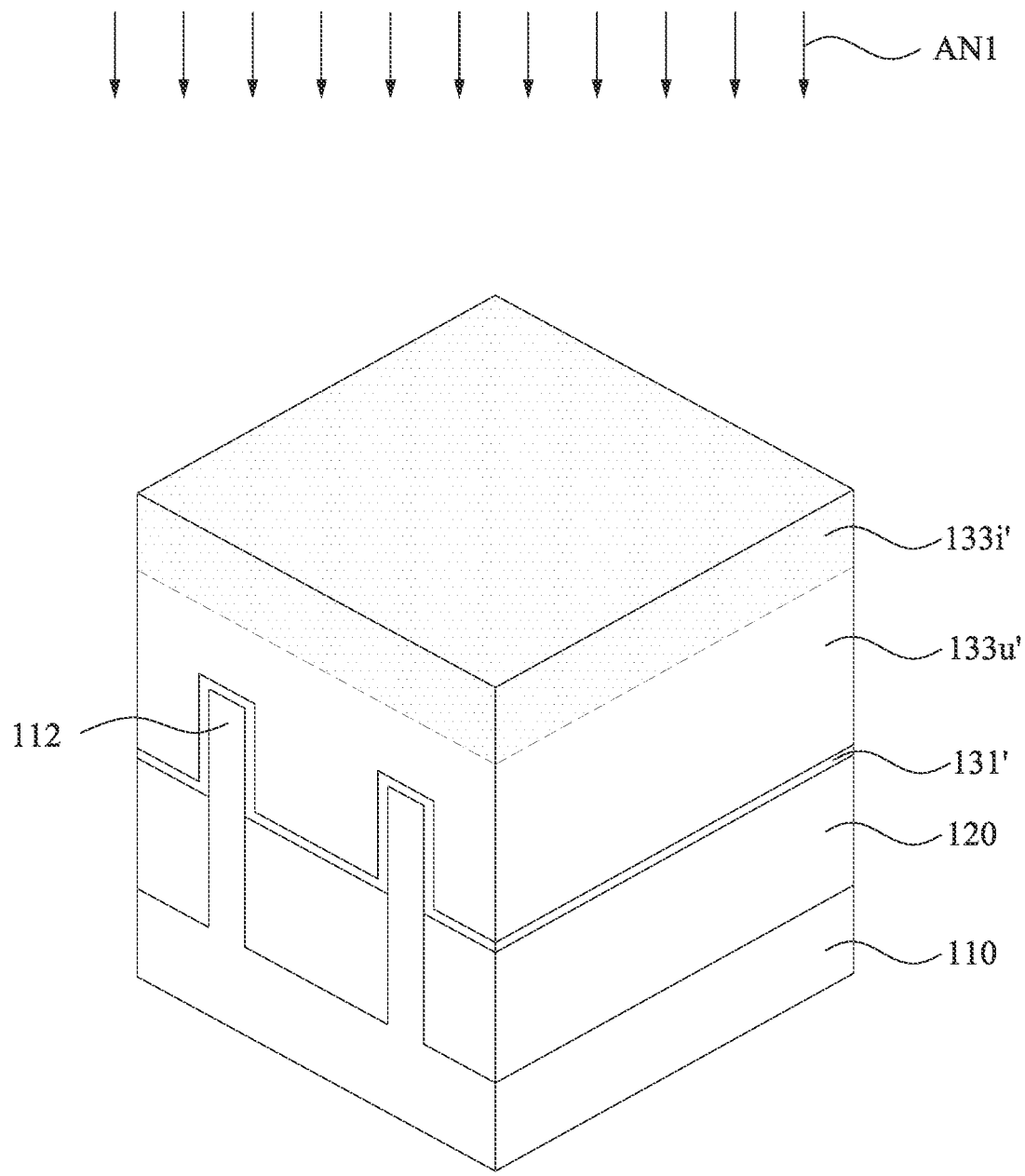
FIG. 20 illustrates a method for manufacturing the semiconductor device at various stages in accordance with some embodiments of the present disclosure.

FIG. 19 is a flowchart of a method Mc for making a semiconductor device (or an integrated circuit structure) according to aspects of the present disclosure in various embodiments. Throughout the various views and illustrative embodiments, like reference numbers are used to designate like elements. The present embodiment may repeat reference numerals and/or letters used in FIGS. 2-15. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIG. 20, which illustrates a method for manufacturing the semiconductor device at various stages in accordance with some embodiments of the present disclosure.

In operation S12 of method Mc in FIG. 19, a semiconductor fin is formed over a substrate. In operation S14 of method Mc in FIG. 19, isolation structures are formed over the substrate and surround the semiconductor fin. In operation S16 of method Mc in FIG. 19, a dummy gate layer is formed over the substrate. In operation S18 of method Mc in FIG. 19, the dummy gate layer is etched back. In operation S20 of method Mc in FIG. 19, the dummy gate layer is implanted to form an implantation layer therein. The details in operations S12, S14, S16, S18, and S20 are described above as shown in FIGS. 2-6, and, therefore, a description in this regard will not be repeated hereinafter.

In operation S36 of method Mc in FIG. 19, the implantation region is annealed. For example, in FIG. 20, an anneal process AN1 may be performed to the implantation region 133$i'$ to repair the crystalline structure of the implantation region 133$i'$ damaged by the implantation process IMP1. In some embodiments, the anneal process AN1 is performed under a temperature ranging between about 300° C. and about 1200° C., during a time period ranging between about 10 ms to about 1000 s, and under few mtorr to few atm pressure. After the anneal process AN1, the implantation region 133$i'$ is transformed from amorphous structure into polycrystalline structure but the stress thereof is barely changed. Hence, the annealed implantation region 133$i'$, which can be referred to as a top polycrystalline semiconductor layer, is still closer to the neutral stress than the un-implanted dummy gate layer 133$u'$, which can be referred to as a bottom polycrystalline semiconductor layer. That is, a stress of the un-implanted dummy gate layer 133$u'$ is more compressive than a stress of the annealed implantation region 133$i'$.

After the operation S36, plural processes are performed. In operation S22 of method Mc in FIG. 19, a HM stack and a patterned PR layer are formed over the dummy gate layer. In operation S24 of method Mc in FIG. 19, the hard mask stack is patterned. In operation S26 of method Mc in FIG. 19, the dummy gate layer is patterned to form dummy gate structures. As mentioned above, the annealed implantation region 133$i'$ has a polycrystalline structure, such that the annealed implantation region 133$i'$ and the un-implanted dummy gate layer 133$u'$ have similar etching rates under the same etchant or etching gas. Therefore, the recipe of the second etching process ET2 (see FIG. 9) may be the same as or similar to that of the third etching process ET3 (see FIG. 10).

In operation S28 of method Mc in FIG. 19, a spacer structure is formed over the substrate to surround the dummy gate structure. In operation S30 of method Mc in FIG. 19, source/drain epitaxial structures are formed over the semiconductor fin. In operation S32 of method Mc in FIG. 19, the dummy gate structure is replaced with a metal gate structure. In operation S34 of method Mc in FIG. 19, source/drain contacts are formed above the source/drain epitaxial structures. The details in operations S22, S24, S26, S28, S30, S32, and S34 are described above as shown in FIGS. 7-15, and, therefore, a description in this regard will not be repeated hereinafter.

Figure 21:
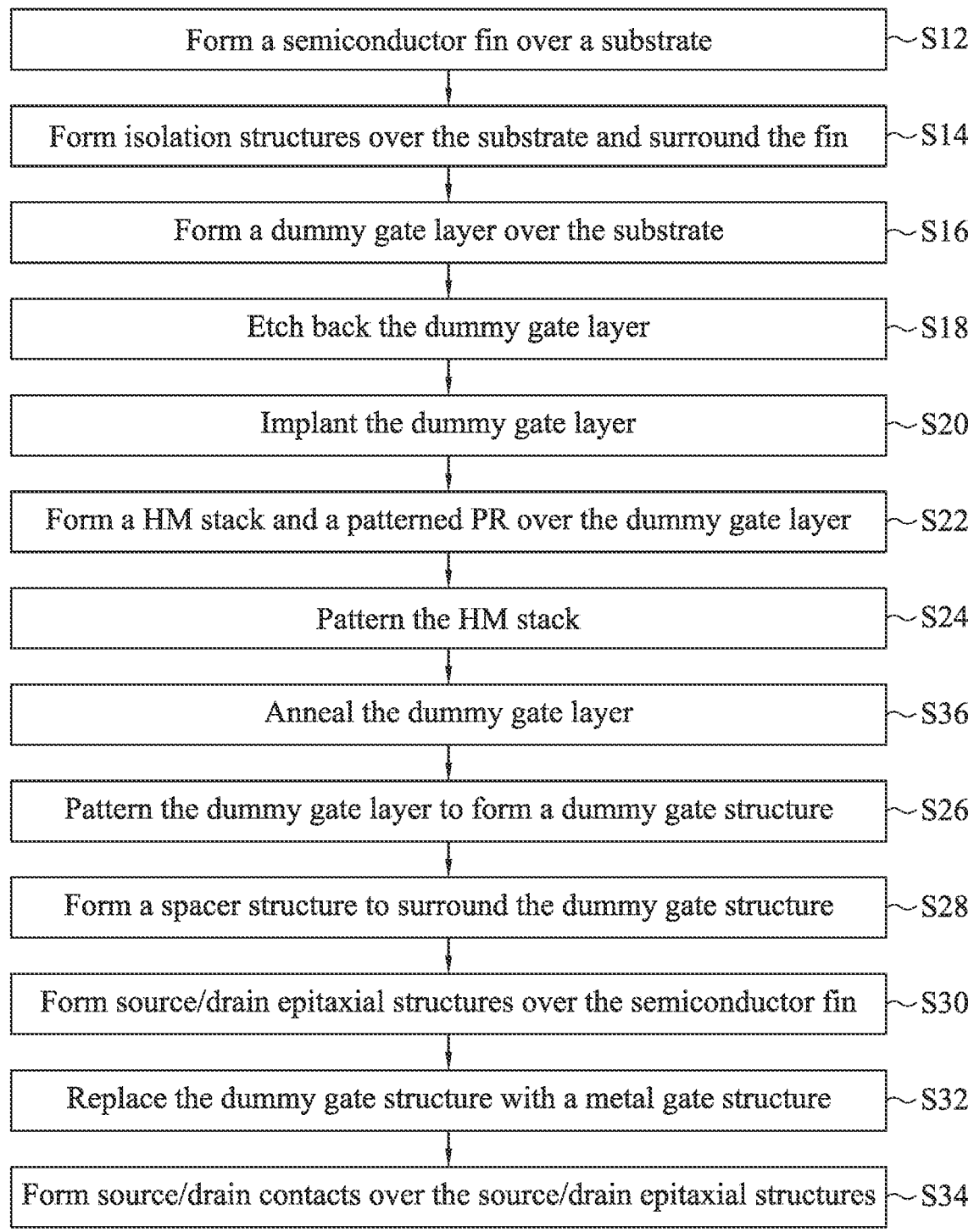
FIG. 21 is a flowchart of a method for making a semiconductor device (or an integrated circuit structure) according to aspects of the present disclosure in various embodiments.
Figure 22:
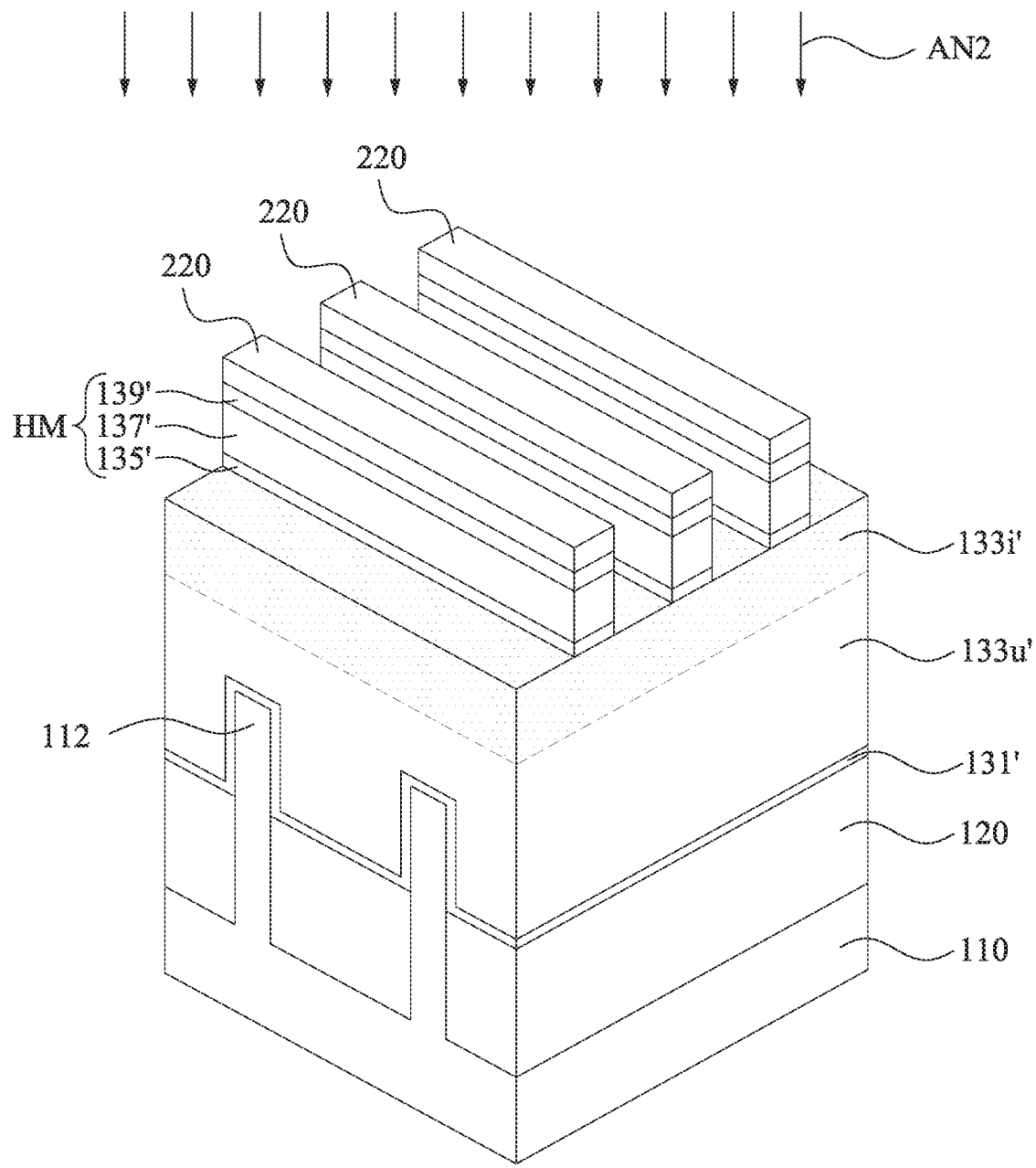
FIG. 22 illustrates a method for manufacturing the semiconductor device at various stages in accordance with some embodiments of the present disclosure.

FIG. 21 is a flowchart of a method Md for making a semiconductor device (or an integrated circuit structure) according to aspects of the present disclosure in various embodiments. Throughout the various views and illustrative embodiments, like reference numbers are used to designate like elements. The present embodiment may repeat reference numerals and/or letters used in FIGS. 2-15. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIG. 22, which illustrates a method for manufacturing the semiconductor device at various stages in accordance with some embodiments of the present disclosure.

In operation S12 of method Md in FIG. 21, a semiconductor fin is formed over a substrate. In operation S14 of method Md in FIG. 21, isolation structures are formed over the substrate and surround the semiconductor fin. In operation S16 of method Md in FIG. 21, a dummy gate layer is formed over the substrate. In operation S18 of method Md in FIG. 21, the dummy gate layer is etched back. In operation S20 of method Md in FIG. 21, the dummy gate layer is implanted to form an implantation layer therein. In operation S22 of method Md in FIG. 21, a HM stack and a patterned PR layer are formed over the dummy gate layer. In operation S24 of method Md in FIG. 21, the hard mask stack is patterned. The details in operations S12, S14, S16, S18, S20, S22, and S24 are described above as shown in FIGS. 2-8, and, therefore, a description in this regard will not be repeated hereinafter.

In operation S36 of method Md in FIG. 21, the implantation region is annealed. For example, in FIG. 22, an anneal process AN2 is performed to the implantation region 133$i'$ to repair the crystalline structure of the implantation region 133$i'$ damaged by the implantation process IMP1. The details of the anneal process AN2 are similar to that of the anneal process AN1 mentioned above, and, therefore, a description in this regard will not be repeated hereinafter.

After the operation S36, plural processes are performed. In operation S26 of method Md in FIG. 21, the dummy gate layer is patterned to form dummy gate structures. As mentioned above, the recipe of the second etching process ET2 (see FIG. 9) may be the same as or similar to that of the third etching process ET3 (see FIG. 10). In operation S28 of method Md in FIG. 21, a spacer structure is formed over the substrate to surround the dummy gate structure. In operation S30 of method Md in FIG. 21, source/drain epitaxial structures are formed over the semiconductor fin. In operation S32 of method Md in FIG. 21, the dummy gate structure is replaced with a metal gate structure. In operation S34 of method Md in FIG. 21, source/drain contacts are formed above the source/drain epitaxial structures. The details in operations S22, S24, S26, S28, S30, S32, and S34 are described above as shown in FIGS. 7-15, and, therefore, a description in this regard will not be repeated hereinafter.

Figure 23:
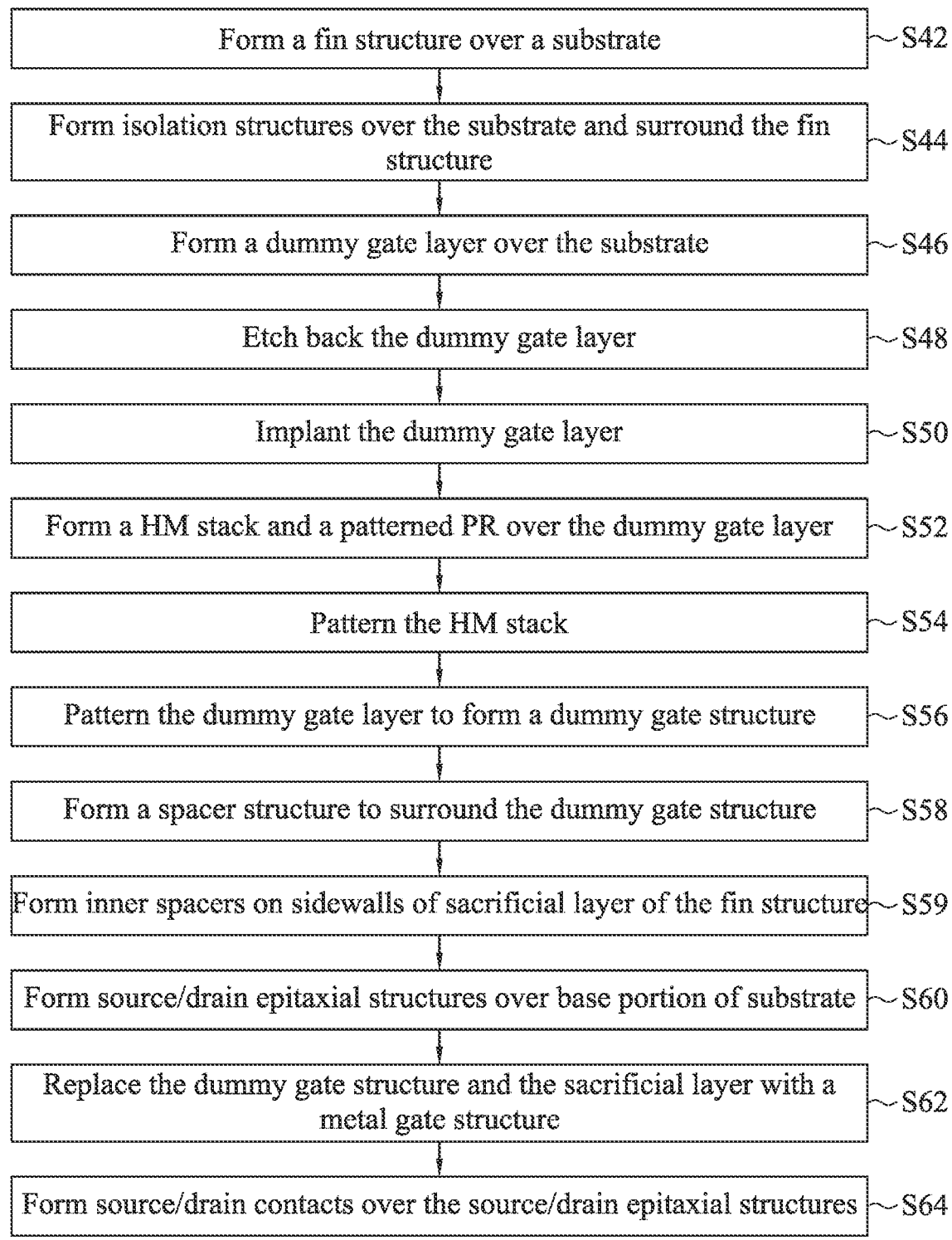
FIG. 23 is a flowchart of a method for manufacturing a semiconductor device (or an integrated circuit structure) according to aspects of the present disclosure in various embodiments.

FIG. 23 is a flowchart of a method Me for manufacturing a semiconductor device (or an integrated circuit structure) according to aspects of the present disclosure in various embodiments. Various operations of the method Me are discussed in association with perspective diagrams FIGS. 24-41. Throughout the various views and illustrative embodiments, like reference numbers are used to designate like elements. FIGS. 24-41 illustrate a method for manufacturing the semiconductor device at various stages in accordance with some embodiments of the present disclosure. In addition to the semiconductor device, FIGS. 24-41 depict X-axis, Y-axis, and Z-axis directions. In some embodiments, the semiconductor device shown in FIGS. 24-41 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 24:
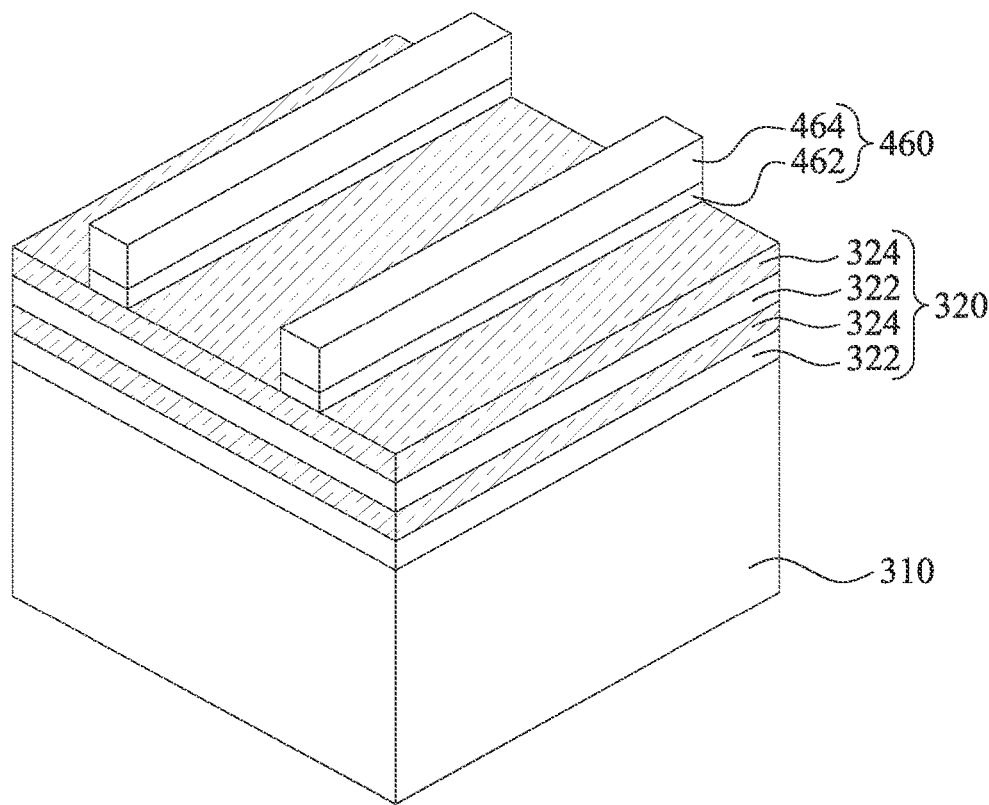
FIGS. 24-41 illustrate a method for manufacturing the semiconductor device at various stages in accordance with some embodiments of the present disclosure.

In operation S42 of method Me in FIG. 23, a fin structure is formed over a substrate. For example, in FIG. 24, a substrate 310 is provided. Materials, configurations, dimensions, processes and/or operations regarding the substrate 310 are similar to or the same as the substrate 110 of FIG. 2. A stacked structure 320 is formed on the substrate 310 through epitaxy, such that the stacked structure 320 forms crystalline layers. The stacked structure 320 includes first semiconductor layers 322 and second semiconductor layers 324 stacked alternately. The first semiconductor layers 322 and the second semiconductor layers 324 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 322 and the second semiconductor layers 324 are made of Si, a Si compound, SiGe, Ge or a Ge compound. In FIG. 24, two layers of the first semiconductor layer 322 and two layers of the second semiconductor layer 324 are disposed. However, the number of the layers are not limited to two, and may be as small as 1 (each layer) and in some embodiments, 3-10 layers of each of the first and second semiconductor layers are formed. By adjusting the numbers of the stacked layers, a driving current of the GAA FET device can be adjusted.

In some embodiments, the first semiconductor layers 322 can be SiGe layers having a germanium atomic percentage greater than zero. In some embodiments, the second semiconductor layers 324 may be pure silicon layers that are free from germanium. The second semiconductor layers 324 may also be substantially pure silicon layers, for example, with a germanium atomic percentage lower than about 1 percent.

The second semiconductor layers 324 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the second semiconductor layers 324 to define a channel or channels of the semiconductor device is further discussed below.

As described above, the second semiconductor layers 324 may serve as channel region(s) for a subsequently-formed semiconductor device and the thickness is chosen based on device performance considerations. The first semiconductor layers 322 in channel regions(s) may eventually be removed and serve to define a vertical distance between adjacent channel region(s) for a subsequently-formed multi-gate device and the thickness is chosen based on device performance considerations. Accordingly, the first semiconductor layers 322 may also be referred to as sacrificial layers, and the second semiconductor layers 324 may also be referred to as channel layers.

Subsequently, a patterned mask layer 460 is formed above the stacked structure 320. In some embodiments, the patterned mask layer 460 includes a first mask layer 462 and a second mask layer 464. The first mask layer 462 may be a pad oxide layer made of a silicon oxide, which can be formed by a thermal oxidation. The second mask layer 464 may be made of a silicon nitride (SiN), which is formed by chemical vapor deposition (CVD), including low pressure CVD (LPCVD) and plasma enhanced CVD (PECVD), plasma enhanced atomic layer deposition (PEALD), atomic layer deposition (ALD), or other suitable process.

Figure 25:
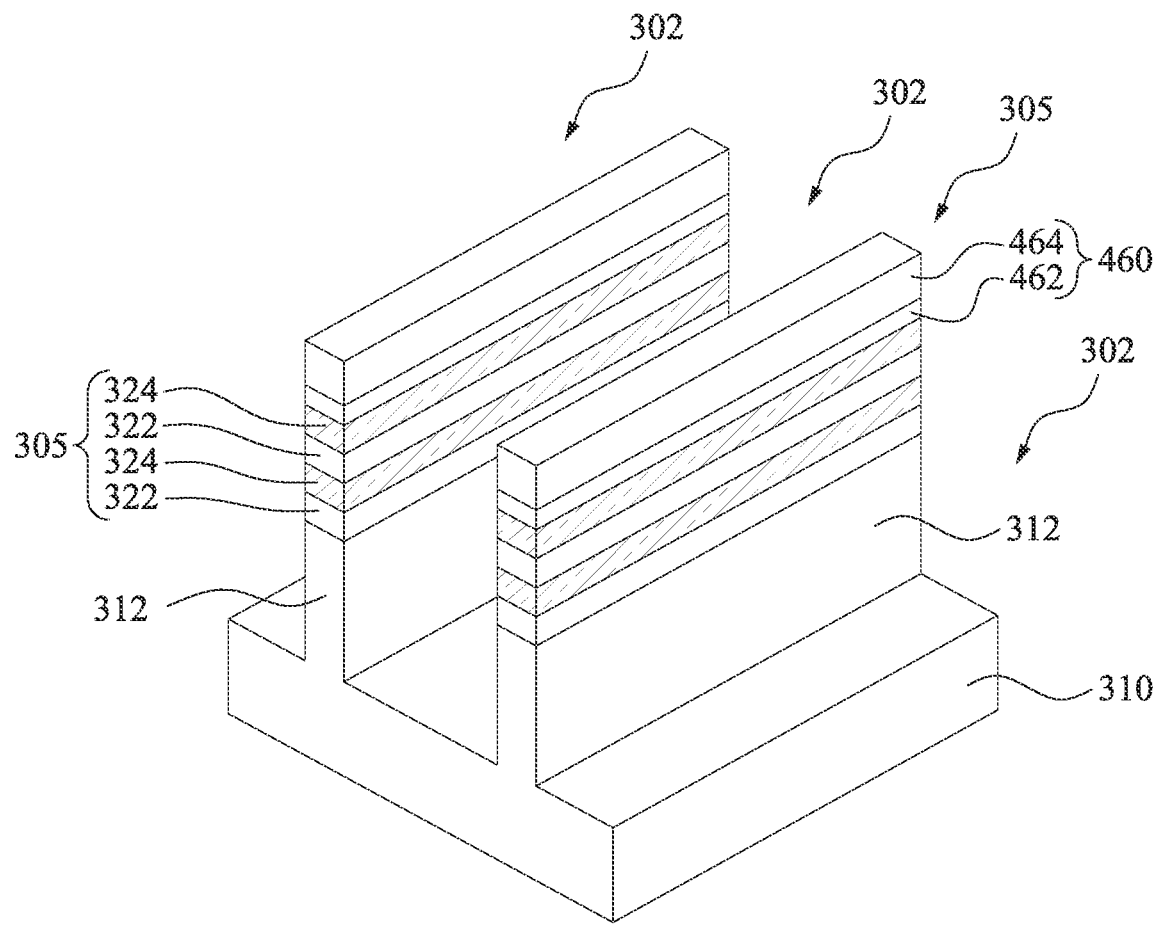
Figure 25:
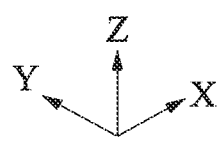
Figure 26:
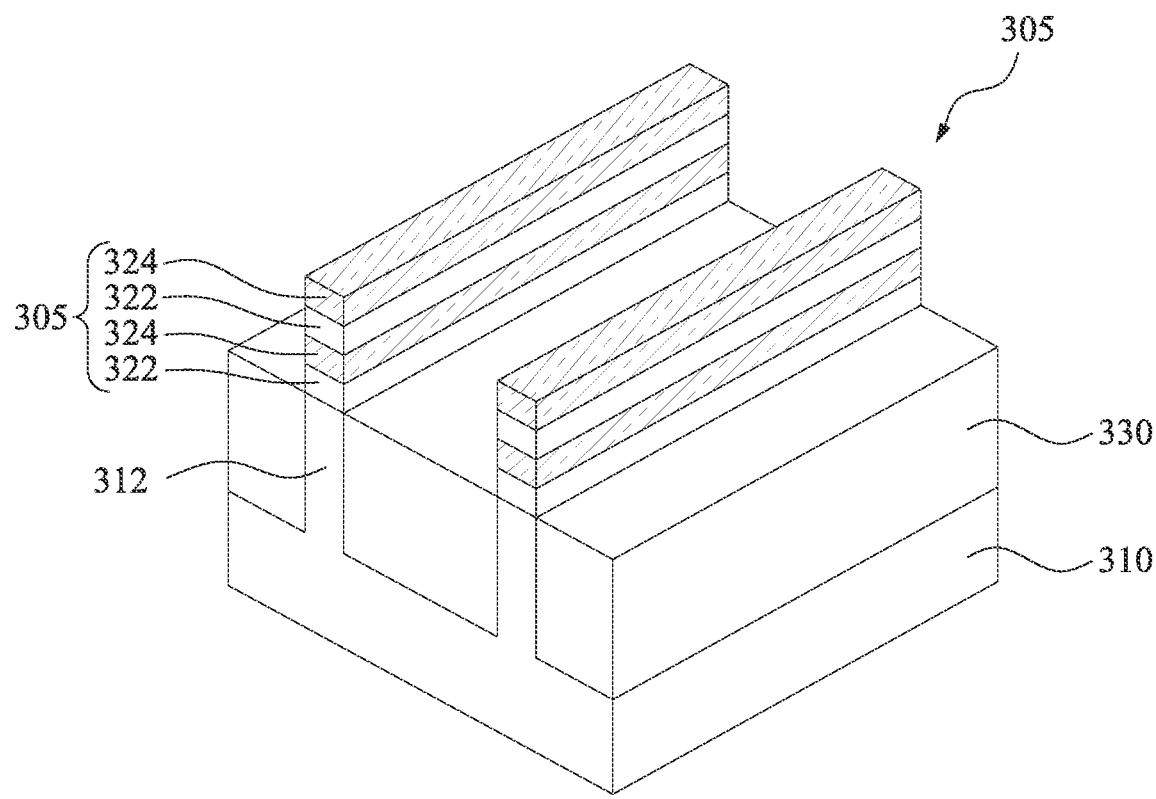
Figure 26:
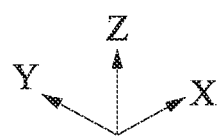

Reference is made to FIG. 25. The stacked structure 320 (see FIG. 24) is patterned by using the patterned mask layer 460 as an etch mask, such that the stacked structure 320 is patterned into fin structures 305 and trenches 302 extending in the X direction. In FIG. 25, two fin structures 305 are arranged in the Y direction. But the number of the fin structures is not limited to, and may be as small as one and three or more. In some embodiments, one or more dummy fin structures are formed on both sides of the fin structures 305 to improve pattern fidelity in the patterning operations.

The trenches 302 extend into the substrate 310 and have lengthwise directions substantially parallel to each other. The trenches 302 form base portions 312 in the substrate 310, where the base portions 312 protrude from the substrate 310, and the fin structures 305 are respectively formed above the base portions 312 of the substrate 310. The remaining portions of the stacked structure 320 are accordingly referred to as the fin structures 305 alternatively.

In operation S44 of method Me in FIG. 23, isolation structures are formed over the substrate and surround the fin structure. For example, in FIG. 26, after the fin structures 305 are formed, isolation structures 330 are formed above the structure in FIG. 25 so that top portions of the fin structures 305 are exposed. Materials, configurations, dimensions, processes and/or operations regarding the isolation structures 330 are similar to or the same as the isolation structures 120 of FIG. 3.

In operation S46 of method Me in FIG. 23, a dummy gate layer is formed over the substrate. For example, in FIG. 27, after the isolation structures 330 are formed, a dummy dielectric layer 341' and a dummy gate layer 343' are formed above the structure in FIG. 26. Materials, configurations, dimensions, processes and/or operations regarding the dummy dielectric layer 341' and the dummy gate layer 343' are similar to or the same as the dummy dielectric layer 131' and the dummy gate layer 133' of FIG. 4, respectively.

Figure 27:
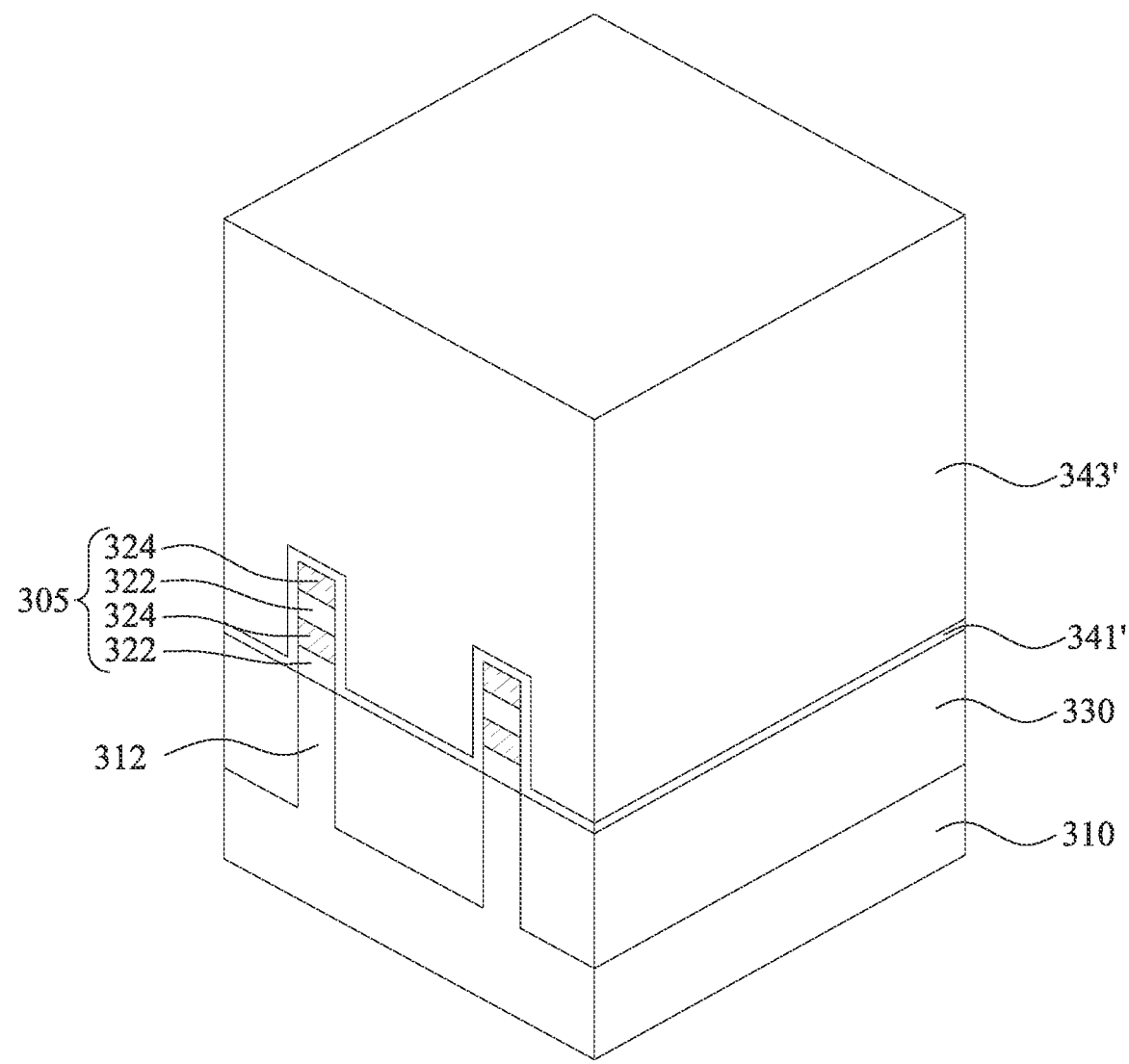
Figure 28:
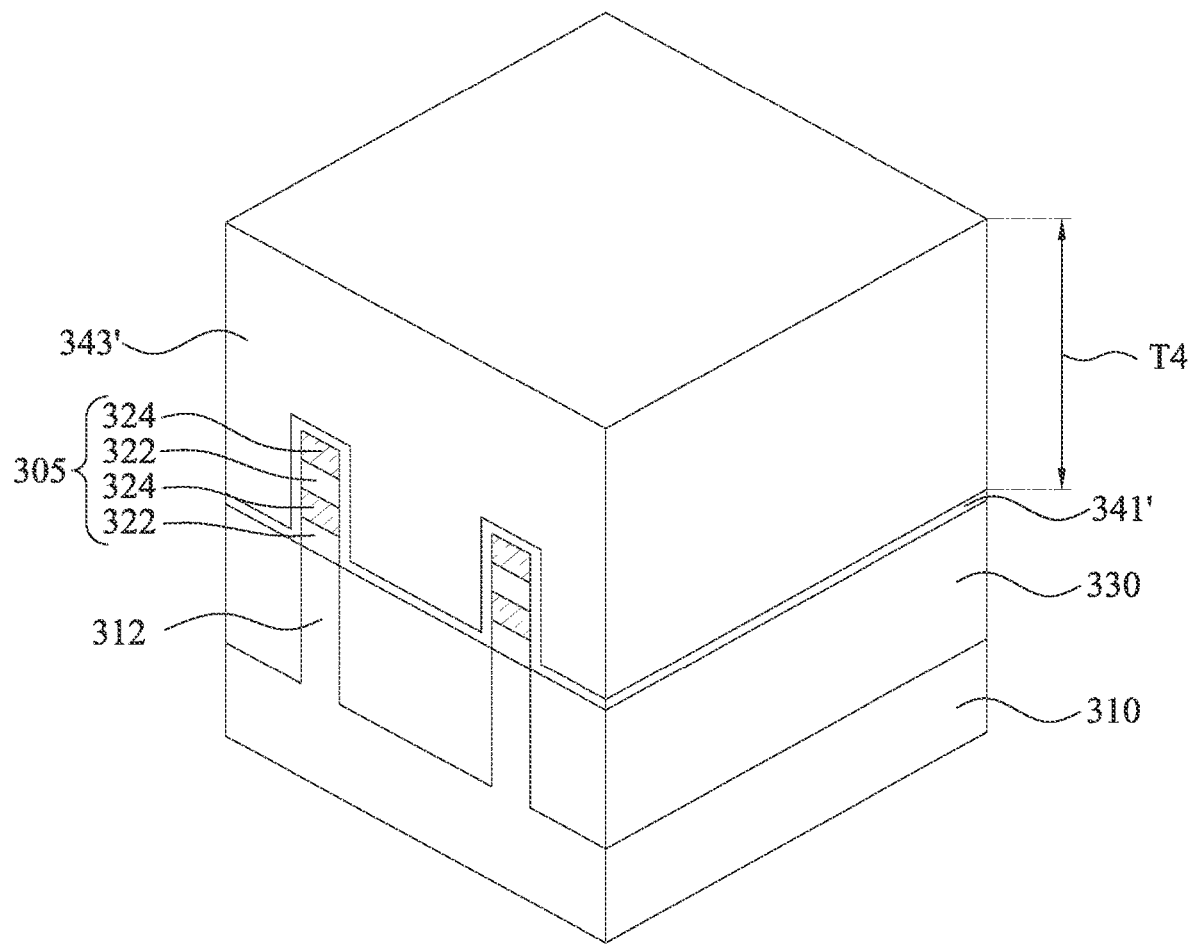
Figure 29:
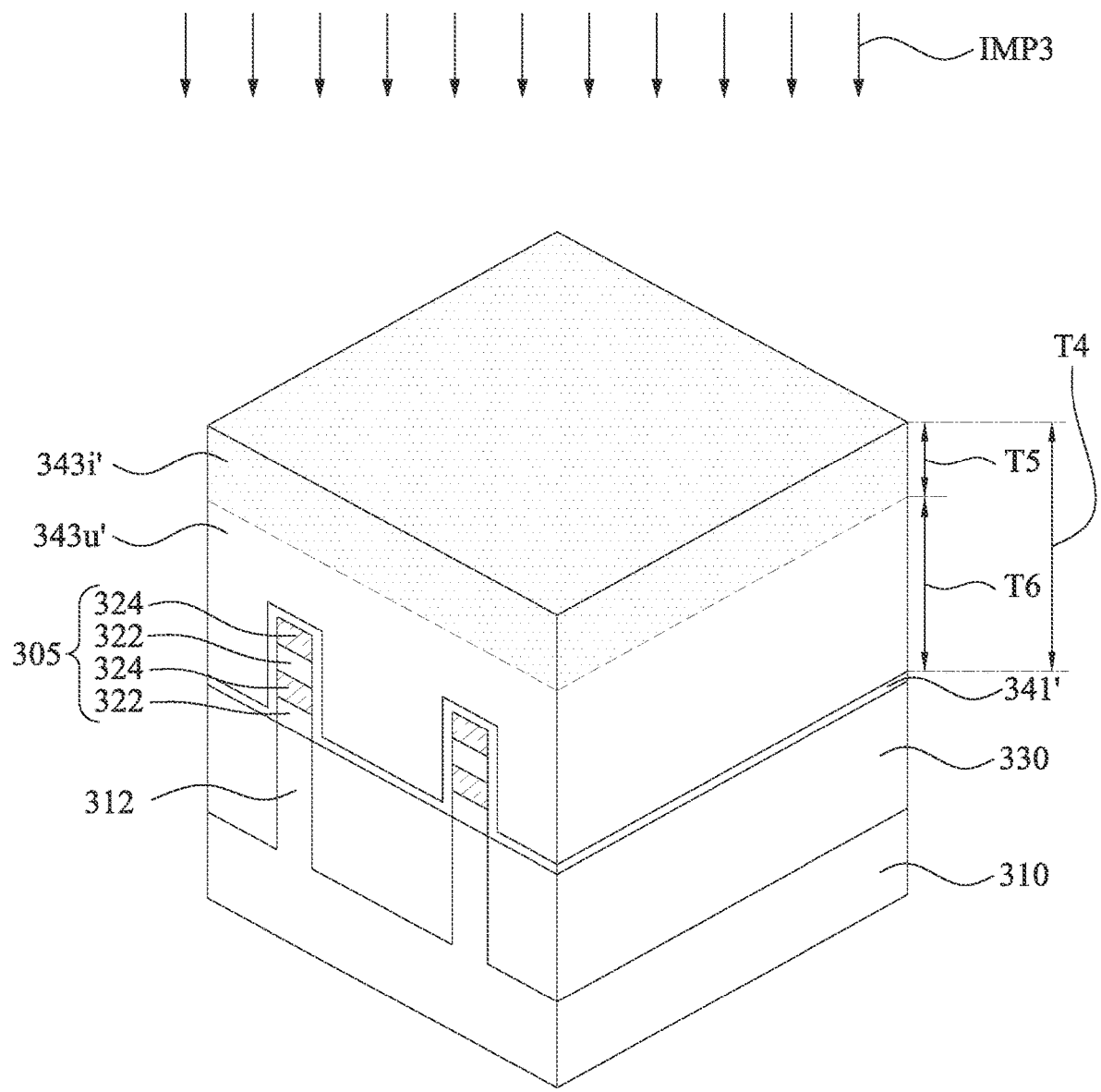
Figure 30:
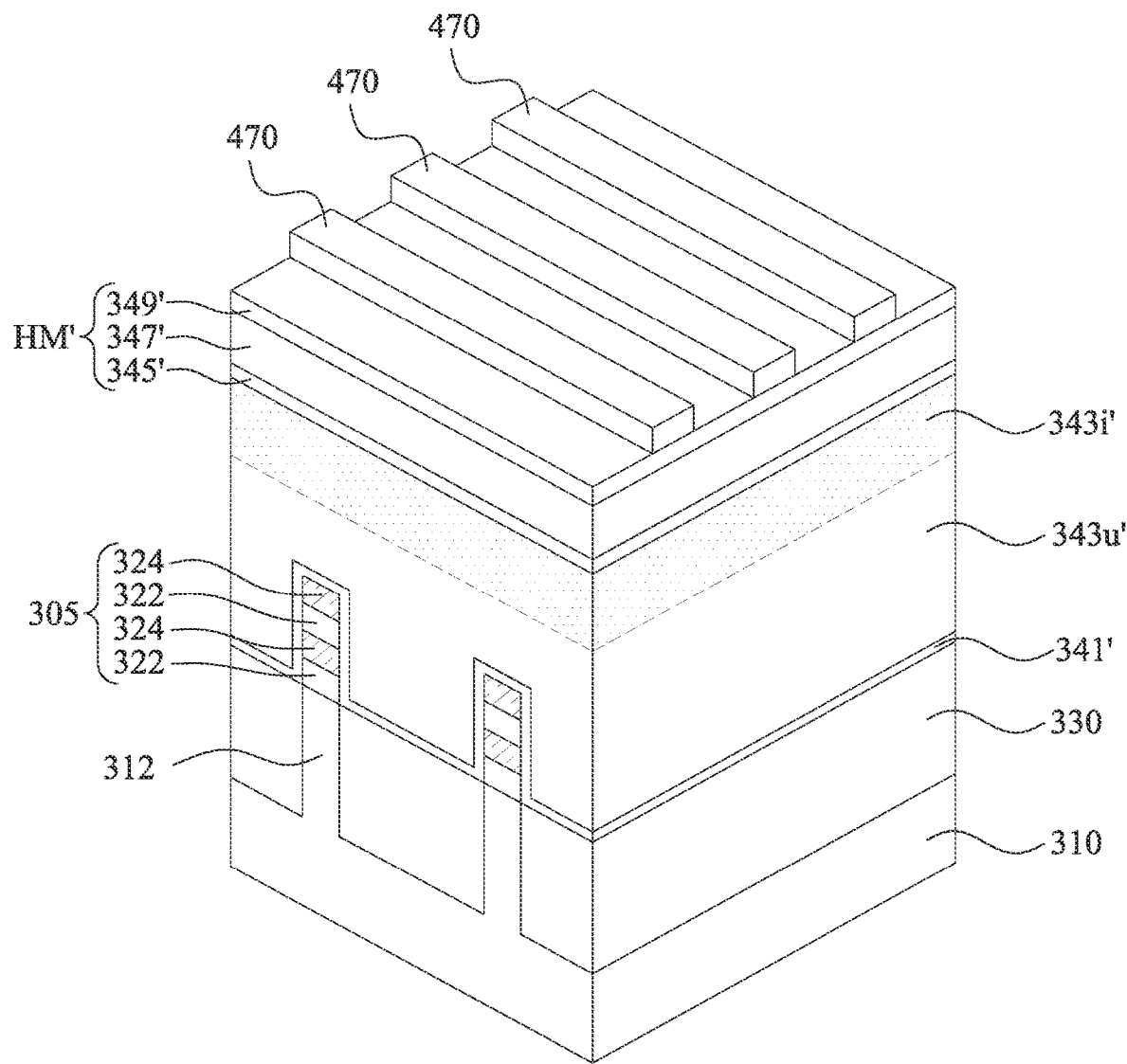
Figure 31:
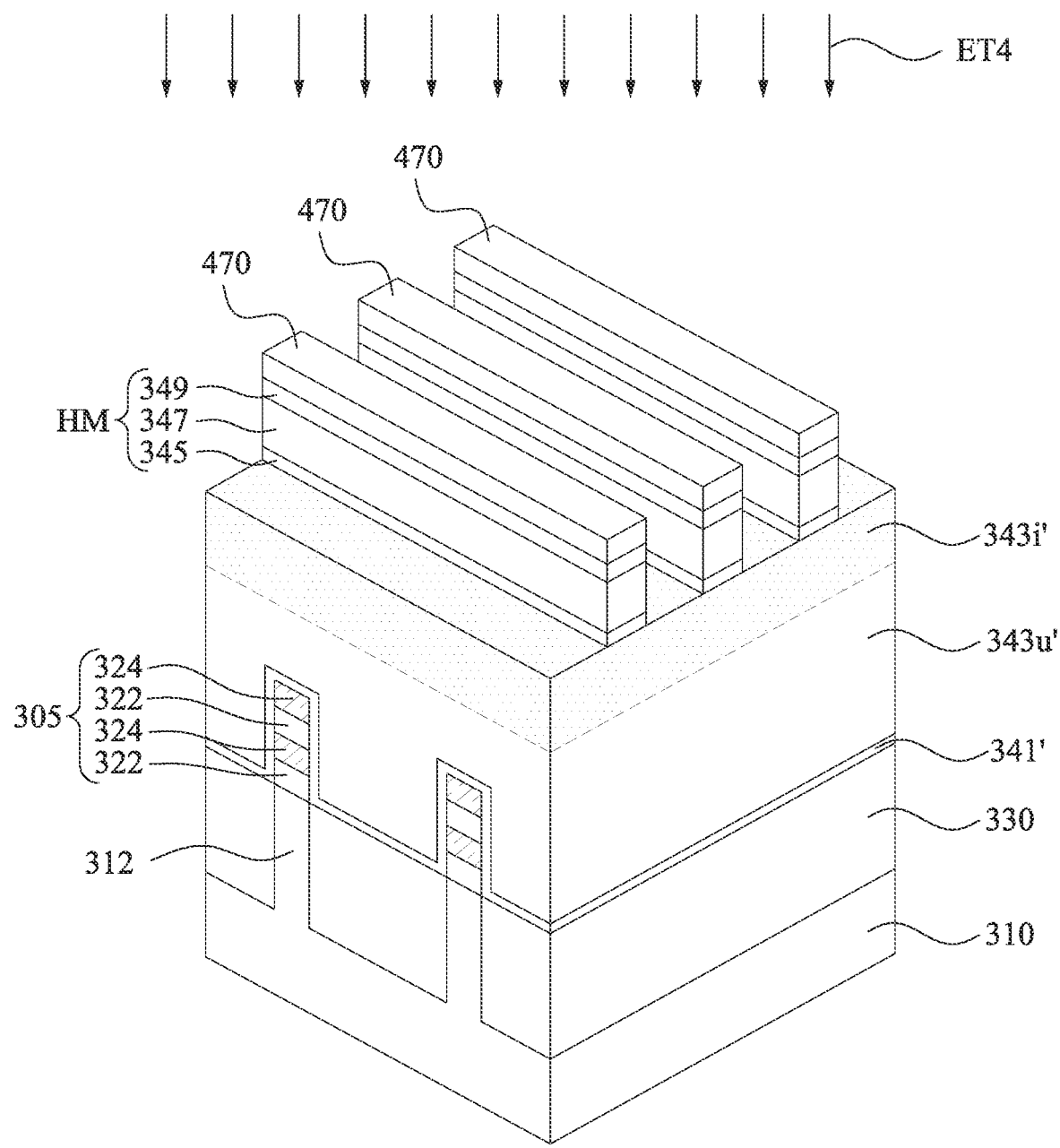
Figure 32:
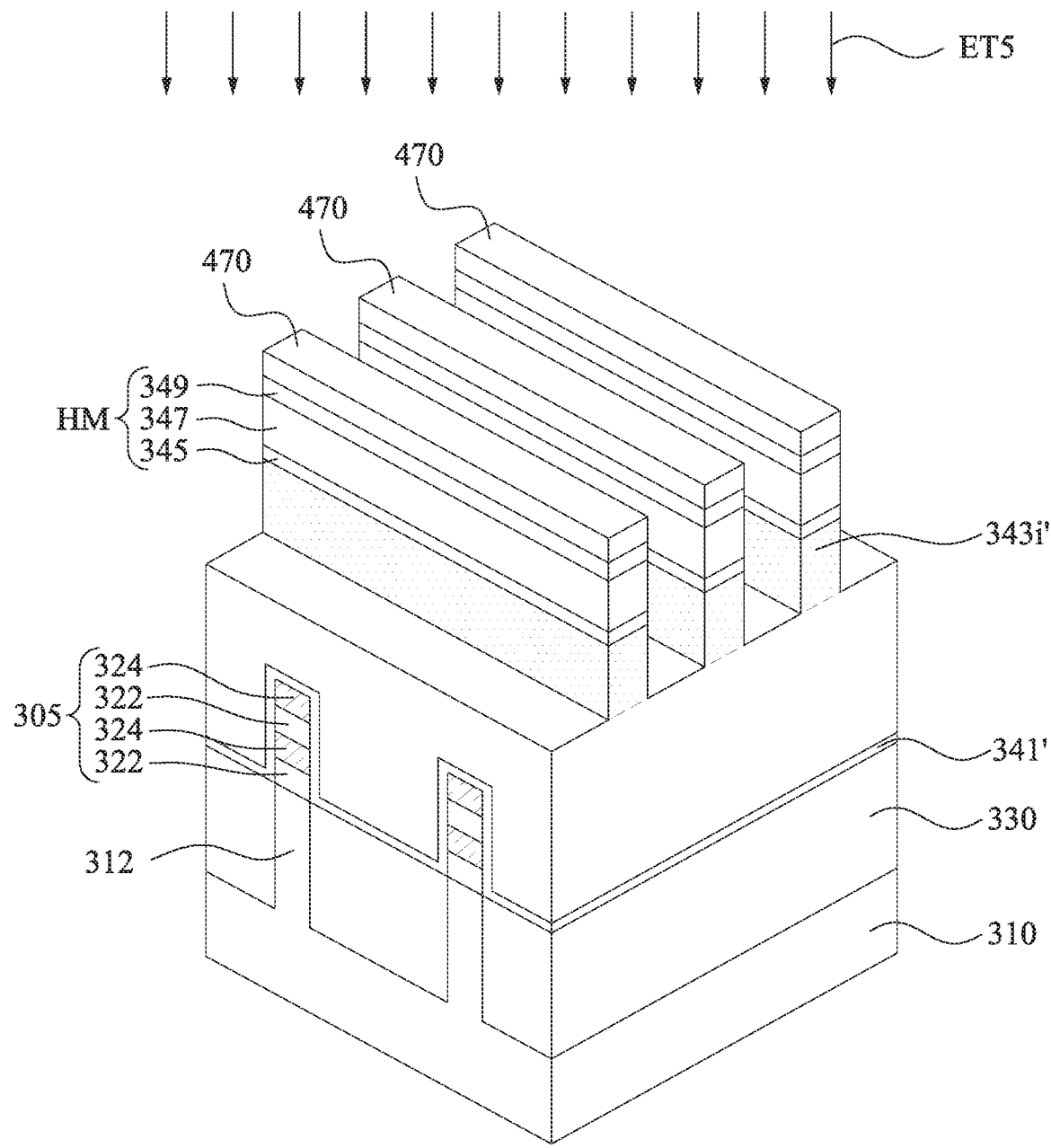
Figure 33:
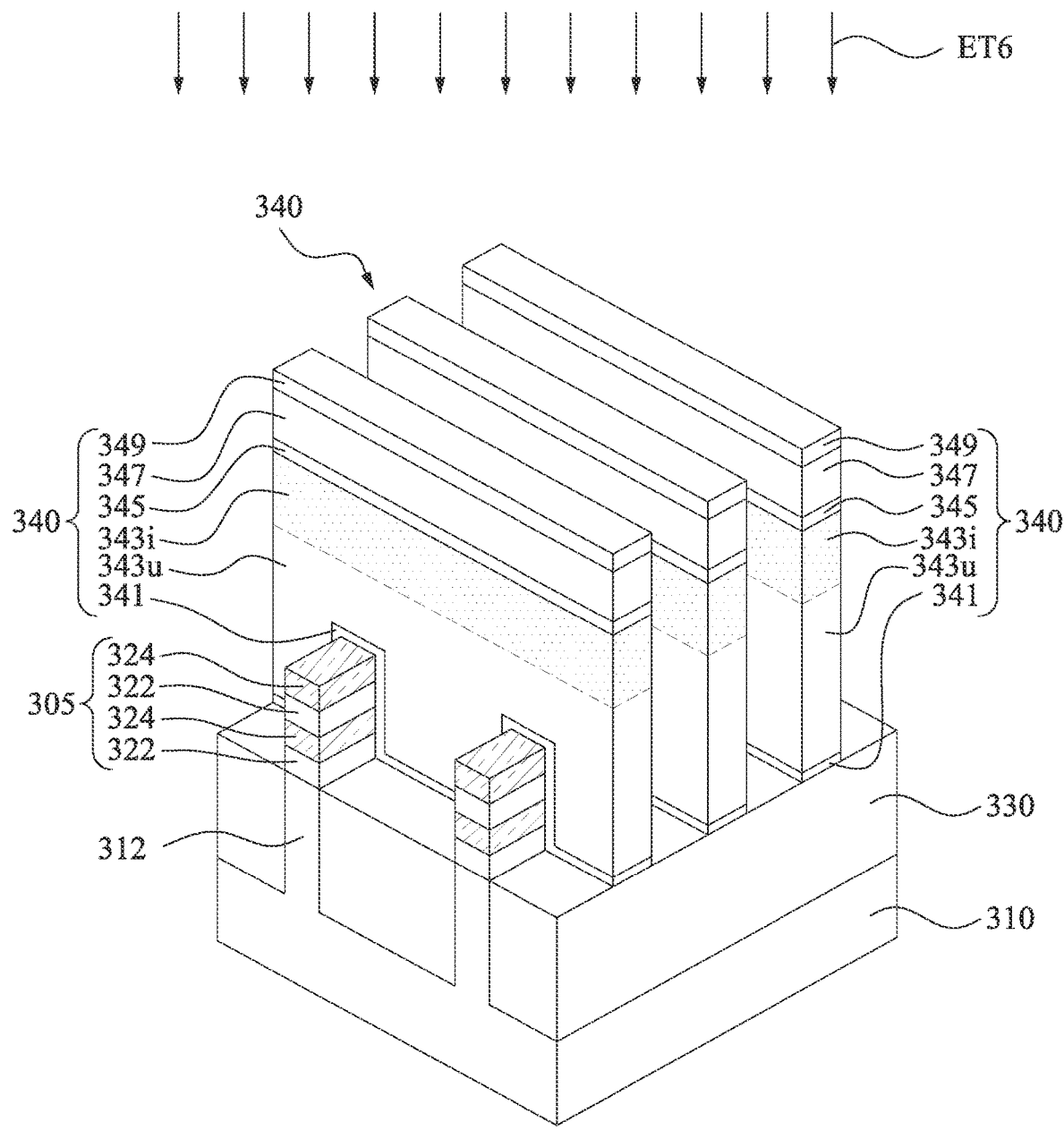
Figure 34:
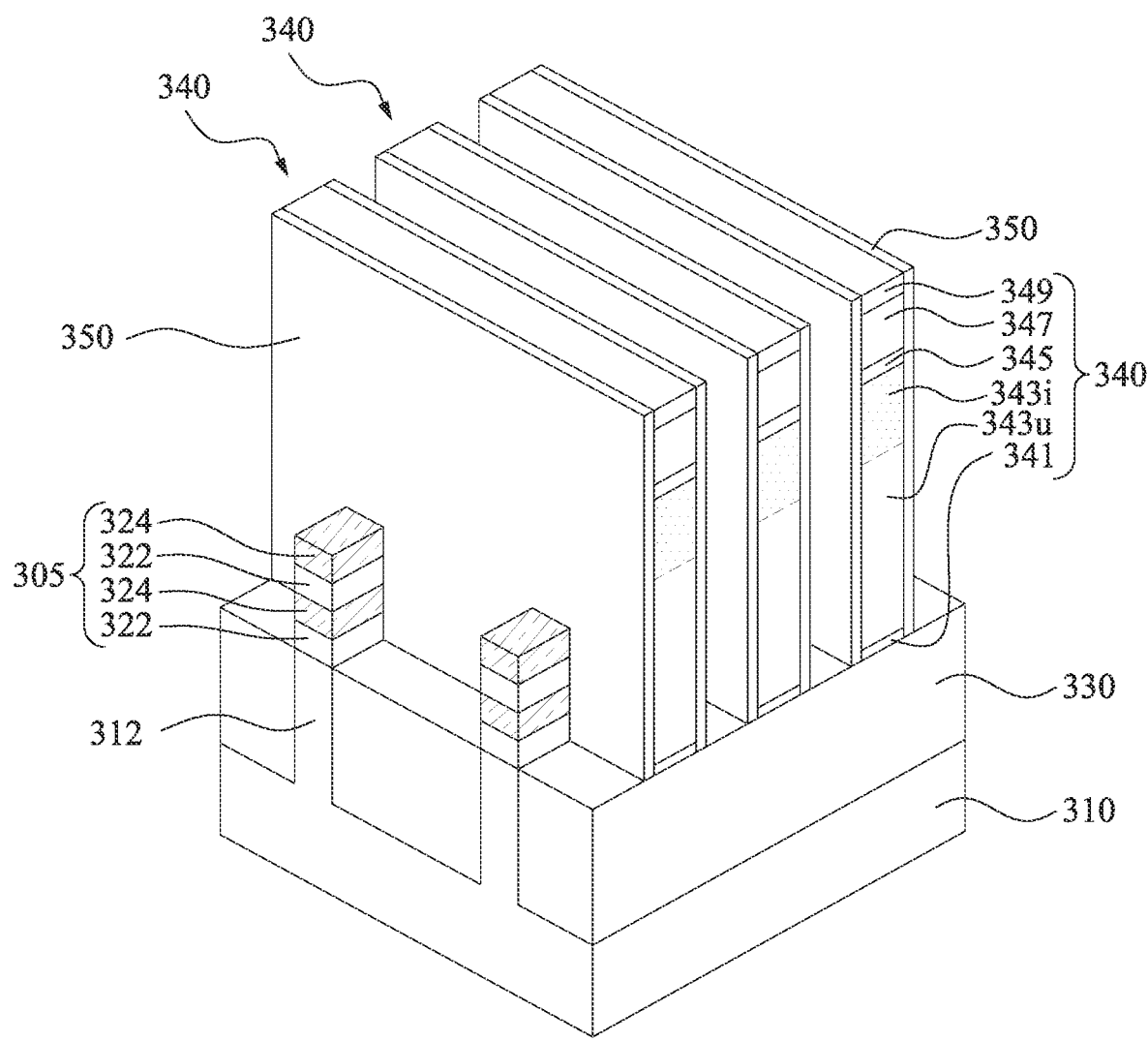
Figure 35:
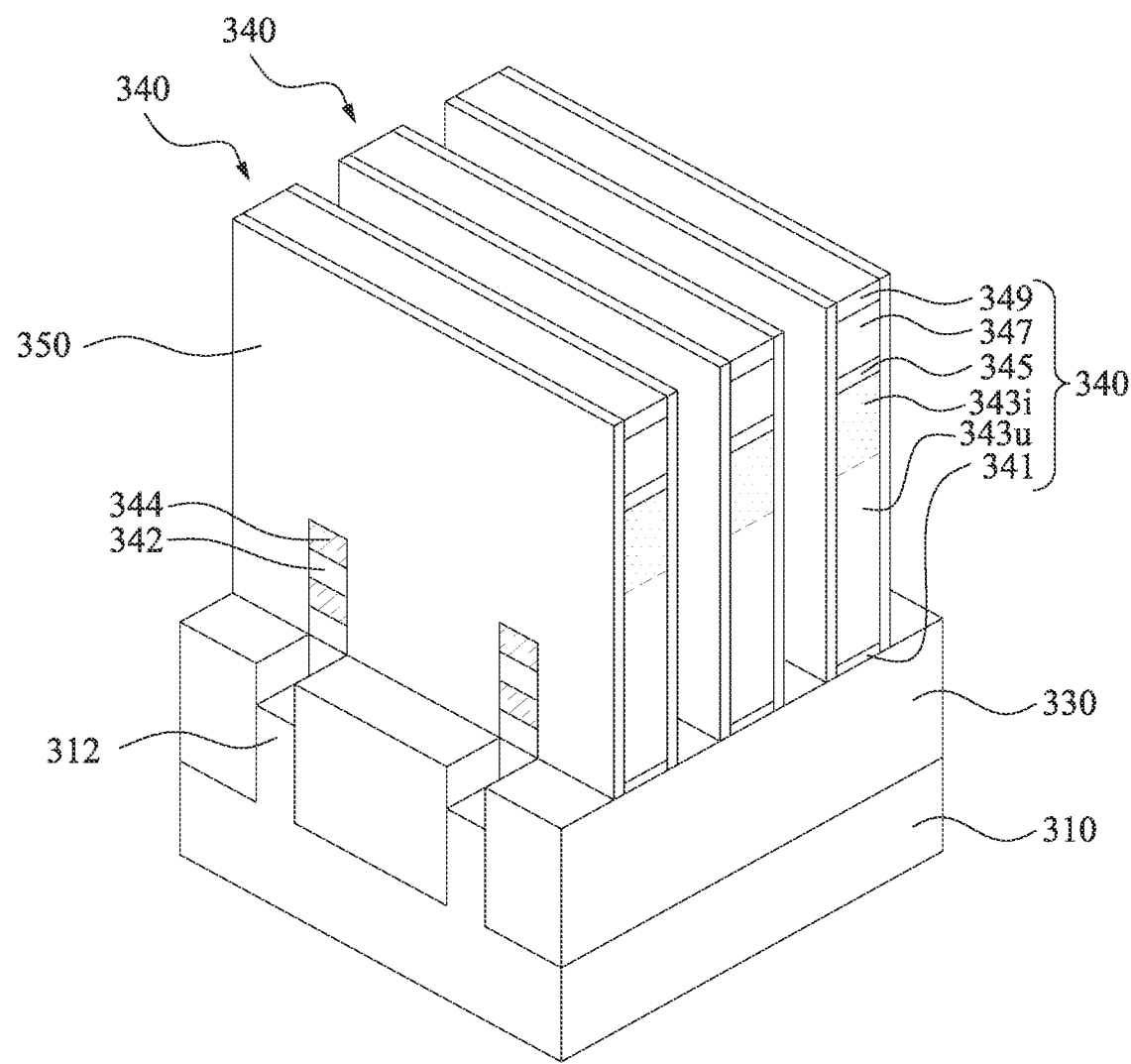

In operation S48 of method Me in FIG. 23, the dummy gate layer is etched back. For example, in FIG. 28, an etching process is performed to remove a top portion of the dummy gate layer 343' such that the height of the dummy gate layer 343' is reduced (as shown in FIGS. 27 and 28). Therefore, a vertical thickness T4 of the etched-back dummy gate layer 433' is in a range from about 50 nm to about 500 nm. In some embodiments, the etching process may be one or more dry etching process(es), one or more wet etching process(es), or combinations thereof. Further, as mentioned above, the dummy gate layer 343' include polycrystalline semiconductor and thus has a compressive stress.

In operation S50 of method Me in FIG. 23, the dummy gate layer is implanted to form an implantation layer therein. For example, in FIG. 29, an implantation process IMP3 is performed to dope one or more impurities (e.g., dopants) into the dummy gate layer 343' to form the implantation layer 343$i$', which is formed on the un-implanted dummy gate layer 343$u$'. In some embodiments, a vertical thickness T5 of the implantation region 343$i$' is in a range from about 20% to 50% of the vertical thickness T6 of the dummy gate layer 343'. A vertical thickness T6 of the un-implanted dummy gate layer 343$u$' is greater than the vertical thickness T5 of the implantation region 343$i$' in some embodiments. Materials, configurations, dimensions, processes and/or operations regarding the implantation layer 343$i$' are similar to or the same as the implantation layer 133$i$' of FIG. 6.

In operation S52 of method Ma in FIG. 1, a HM stack and a patterned PR layer are formed over the dummy gate layer. For example, in FIG. 30, a hard mask stack HM' is deposited over the implantation region 343$i$'. In some embodiments, the hard mask stack HM' includes a first hard mask 345', a second hard mask 347' over the first hard mask 345', and a third hard mask 349' over the second hard mask 347'. Materials, configurations, dimensions, processes and/or operations regarding the hard mask stack HM' are similar to or the same as the hard mask stack HM' of FIG. 7.

Subsequently, a patterned photoresist layer 470 is formed over the hard mask stack HM'. Materials, configurations, dimensions, processes and/or operations regarding the patterned photoresist layer 470 are similar to or the same as the patterned photoresist layer 220 of FIG. 7.

In operation S54 of method Me in FIG. 23, the hard mask stack is patterned. For example, in FIG. 31, one or more first etching process(es) ET4 is performed to pattern the hard mask stack HM' by using the patterned photoresist layers 470 as etching masks. As such, hard mask stacks HM each includes a first hard mask 345, a second hard mask 347 over the first hard mask 345, and a third hard mask 349 over the second hard mask 347 are formed. Processes and/or operations regarding the first etching process ET4 are similar to or the same as the first etching process ET1 in FIG. 8.

In operation S56 of method Me in FIG. 23, the dummy gate layer is patterned to form dummy gate structures. For example, in FIGS. 32-33, a second etching process ET5 is performed to etch the implantation region 343$i$' by using the patterned hard mask stack HM as an etch mask and a third etching process ET6 is then performed to etch the un-implanted dummy gate layer 343$u$' and the dummy dielectric layer 341' by using the etched implantation region 343$i$' as an etch mask. Processes and/or operations regarding the second etching process ET5 are similar to or the same as the second etching process ET2 in FIG. 9. Processes and/or operations regarding the third etching process ET6 are similar to or the same as the third etching process ET3 in FIG. 10.

After the preformation of the third etching process ET6, dummy gate structures 340 are formed over the substrate 110. Each of the dummy gate structures 340 includes the dummy dielectric layer 341, the (un-implanted) dummy gate electrode layer 343$u$, the implantation region 343$i$, the first hard mask 345, the second hard mask 347, and the third hard mask 349.

In operation S58 of method Me in FIG. 1, a spacer structure is formed over the substrate to surround the dummy gate structure. For example, in FIG. 34, after formation of the dummy gate structures 340 is completed, spacer structures 350 are formed on sidewalls of the dummy gate structures 340. Materials, configurations, dimensions, processes and/or operations regarding the spacer structures 350 are similar to or the same as the spacer structures 140 of FIG. 11.

In operation S59 of method Me in FIG. 23, inner spacers are formed on sidewalls of sacrificial layers of the fin structure. For example, in FIG. 35, after the formation of the spacer structures 350 is completed, the exposed portions of the fin structures 305 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICP) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch. During the SSD etching process, portions of the base portions 312 are removed as well.

Figure 36:
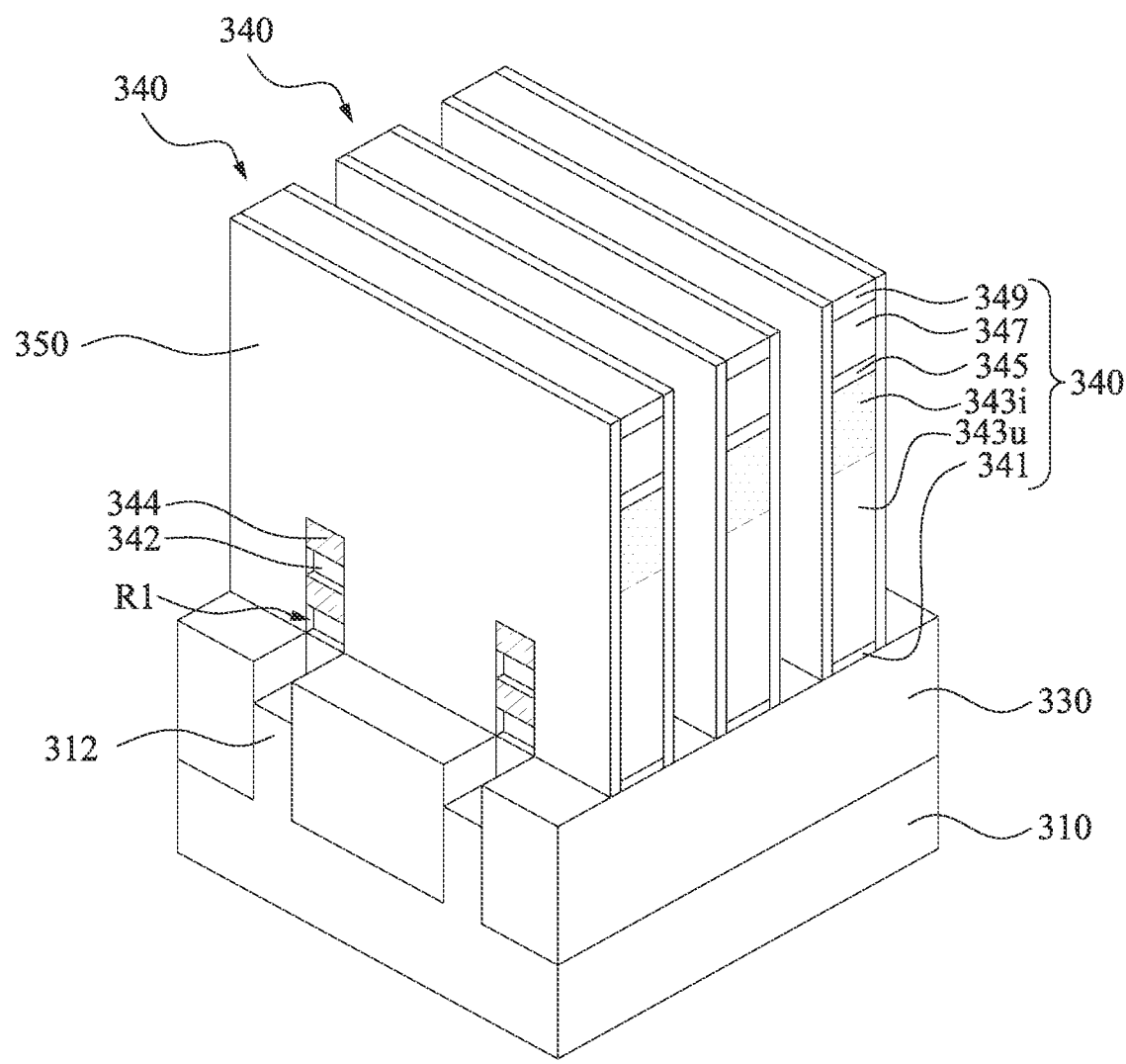

Reference is made to FIG. 36. Subsequently, the first semiconductor layers 322 are horizontally recessed (etched) to for recesses R1 so that the second semiconductor layers 324 laterally extend past opposite end surfaces of the first semiconductor layers 322. In some embodiments, end surfaces of the first semiconductor layers 322 may be substantially vertically aligned with the sidewalls of the spacer structures 350.

Figure 37:
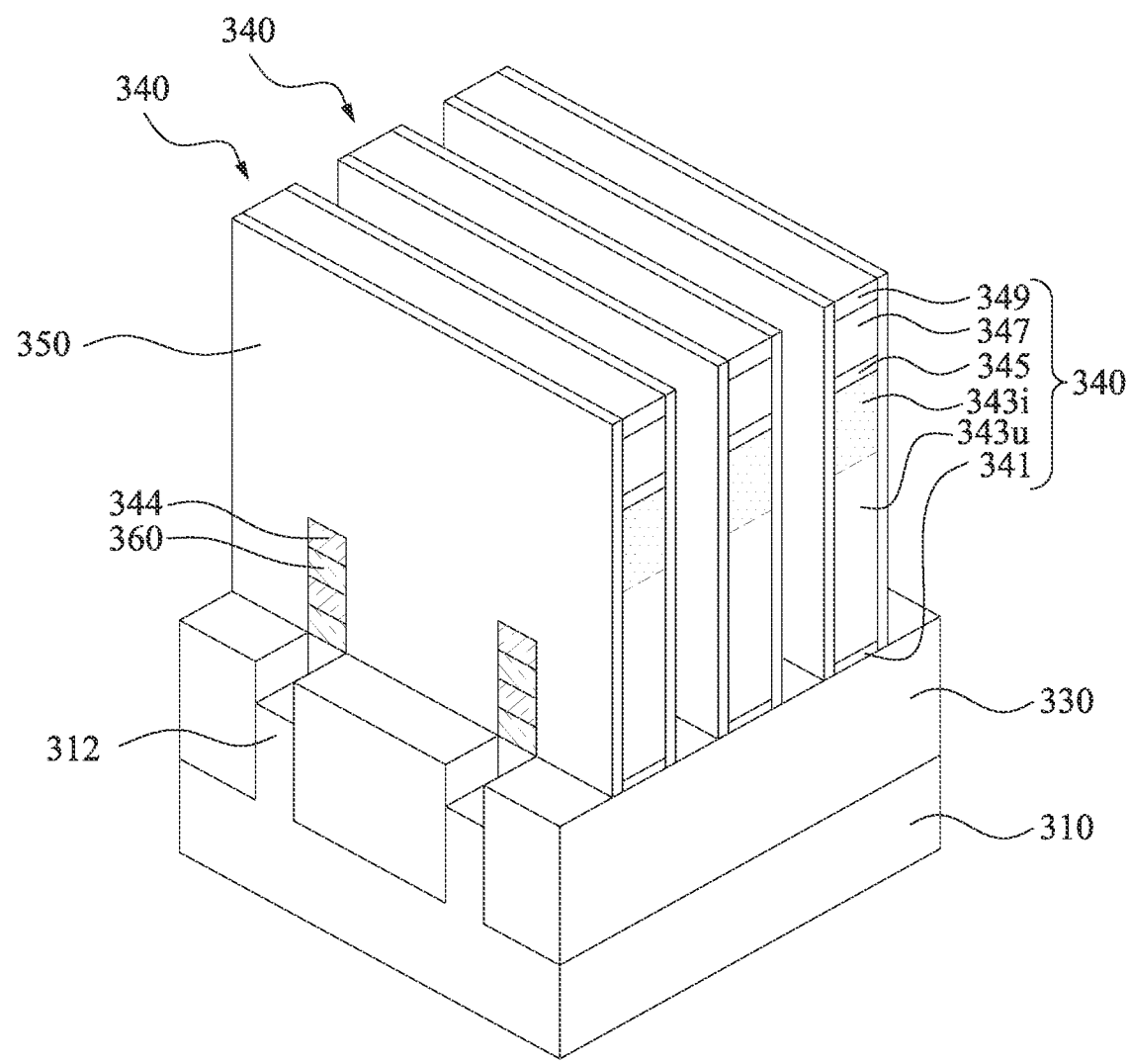
Figure 38:
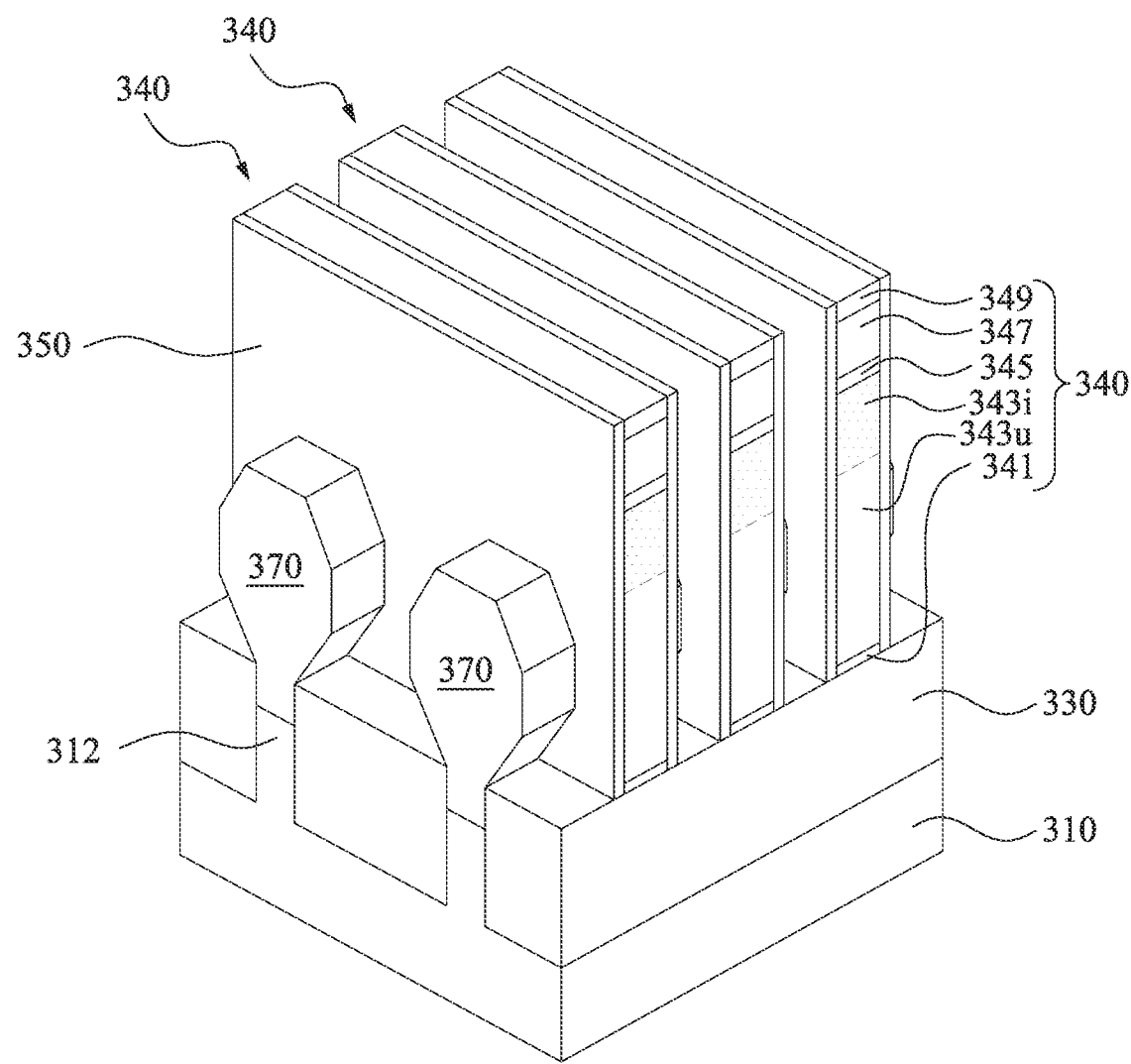

Reference is made to FIG. 37. Inner spacers 360 are respectively formed on sidewalls of the first semiconductor layers 322 (see FIG. 36). For example, a dielectric material layer is formed over the structure of FIG. 36, and one or more etching operations are performed to form the inner spacers 360. In some embodiments, the inner spacers 360 includes a silicon nitride-based material, such as SiN, SiON, SiOCN or SiCN and combinations thereof and is different from the material of the spacer structures 350. In some embodiments, the inner spacers 360 are silicon nitride. The inner spacers 360 may fully fill the recesses R1 as shown in FIG. 37. The dielectric material layer can be formed using CVD, including PECVD, PEALD, ALD, or other suitable processes. The etching operations include one or more wet and/or dry etching operations. In some embodiments, the etching is an isotropic etching in some embodiments.

In operation S60 of method Me in FIG. 23, source/drain epitaxial structures are formed over the base portion of substrate. For example, in FIG. 38, source/drain epitaxial structures 370 are formed on source/drain regions of the base portions 312 that are not covered by the dummy gate structures 340 and the spacer structures 350. Materials, configurations, dimensions, processes and/or operations regarding the source/drain epitaxial structures 370 are similar to or the same as the source/drain epitaxial structures 150 of FIG. 12.

Figure 39:
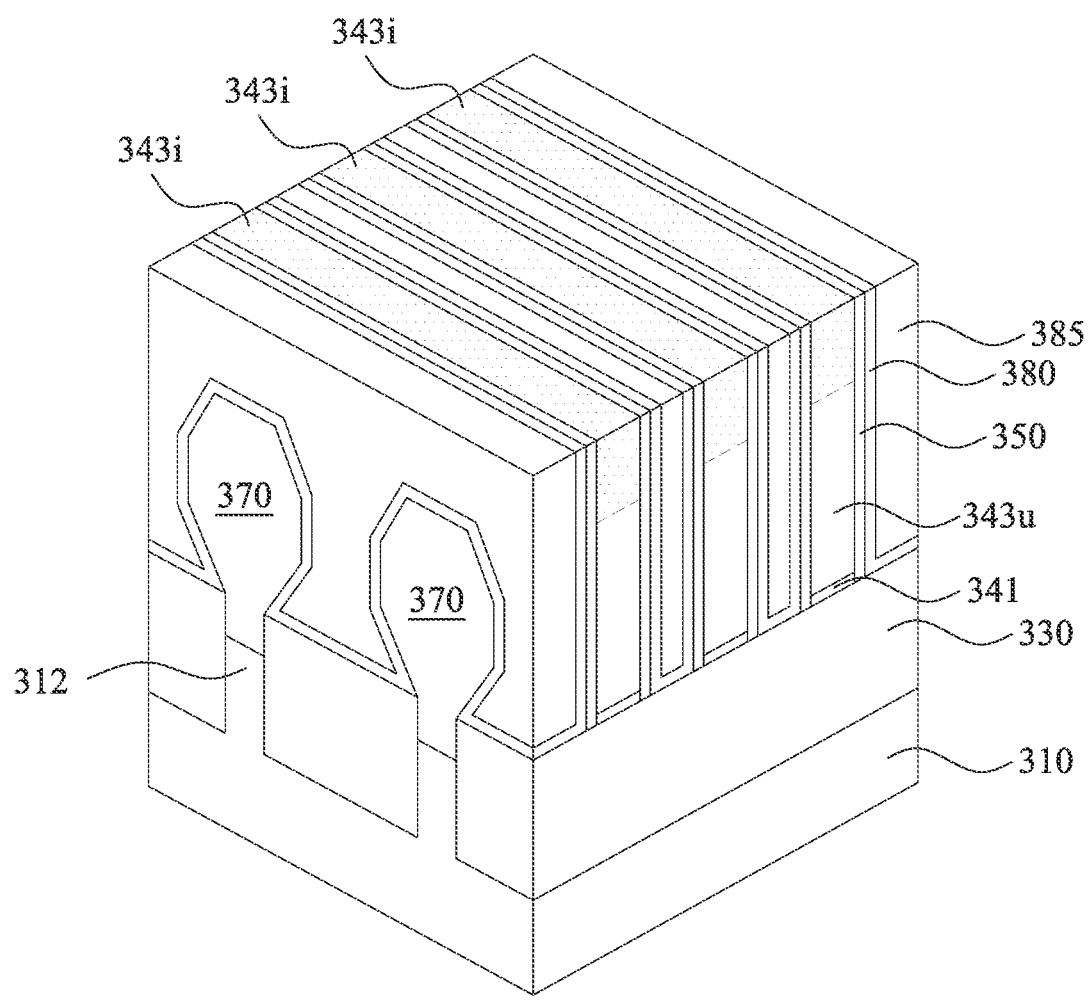

In operation S62 of method Me in FIG. 23, the dummy gate structure and the sacrificial layers are replaced with a metal gate structure. For example, as shown in FIG. 39, an interlayer dielectric (ILD) layer 385 is formed on the substrate 310. In some embodiments, a contact etch stop layer (CESL) 380 is also formed prior to forming the ILD layer 385. Materials, configurations, dimensions, processes and/or operations regarding the ILD layer 385 are similar to or the same as the ILD layer 165 of FIG. 13, and materials, configurations, dimensions, processes and/or operations regarding the CESL 380 are similar to or the same as the CESL 160 of FIG. 13. After forming the ILD layer 385, a planarization process may be performed to remove excessive materials of the ILD layer 385.

Figure 40:
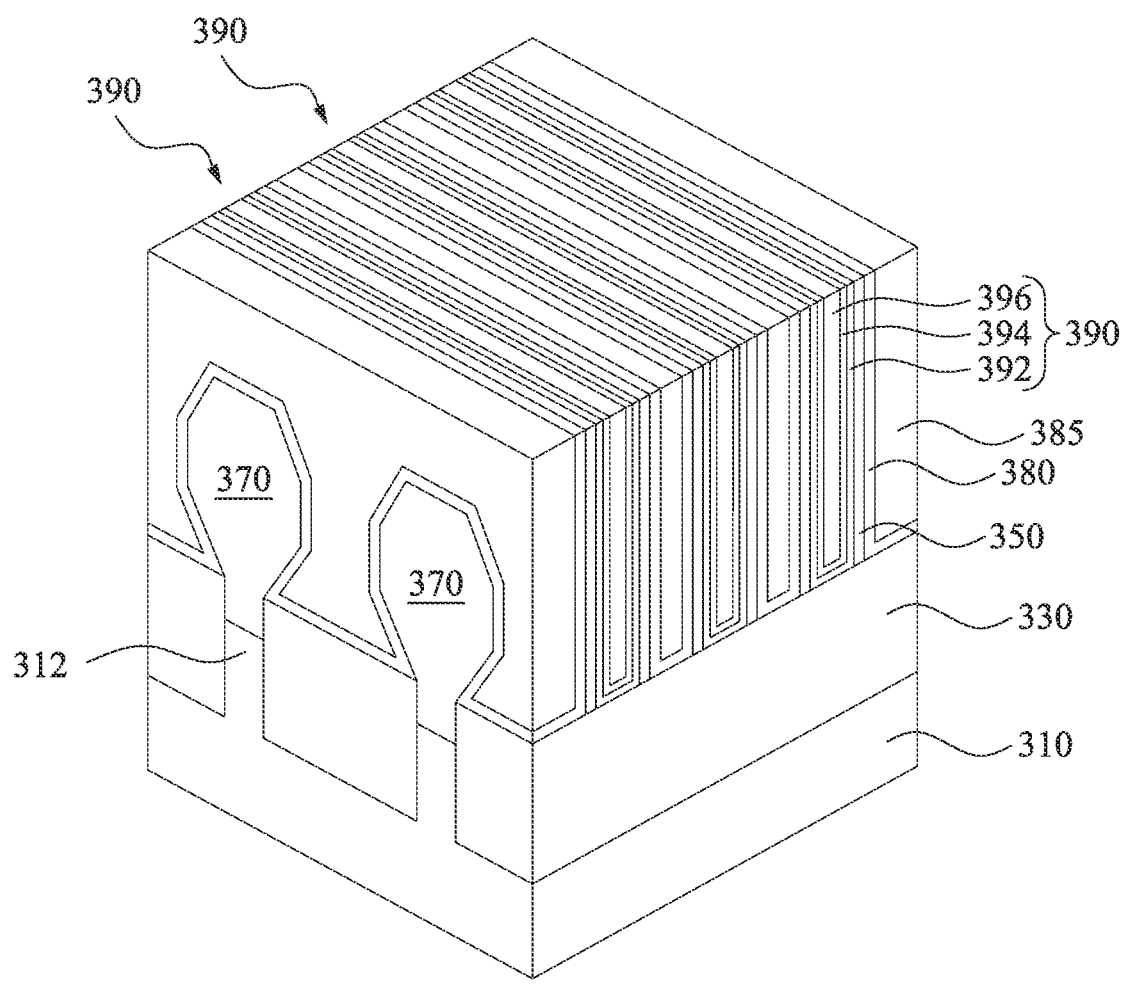
Figure 41:
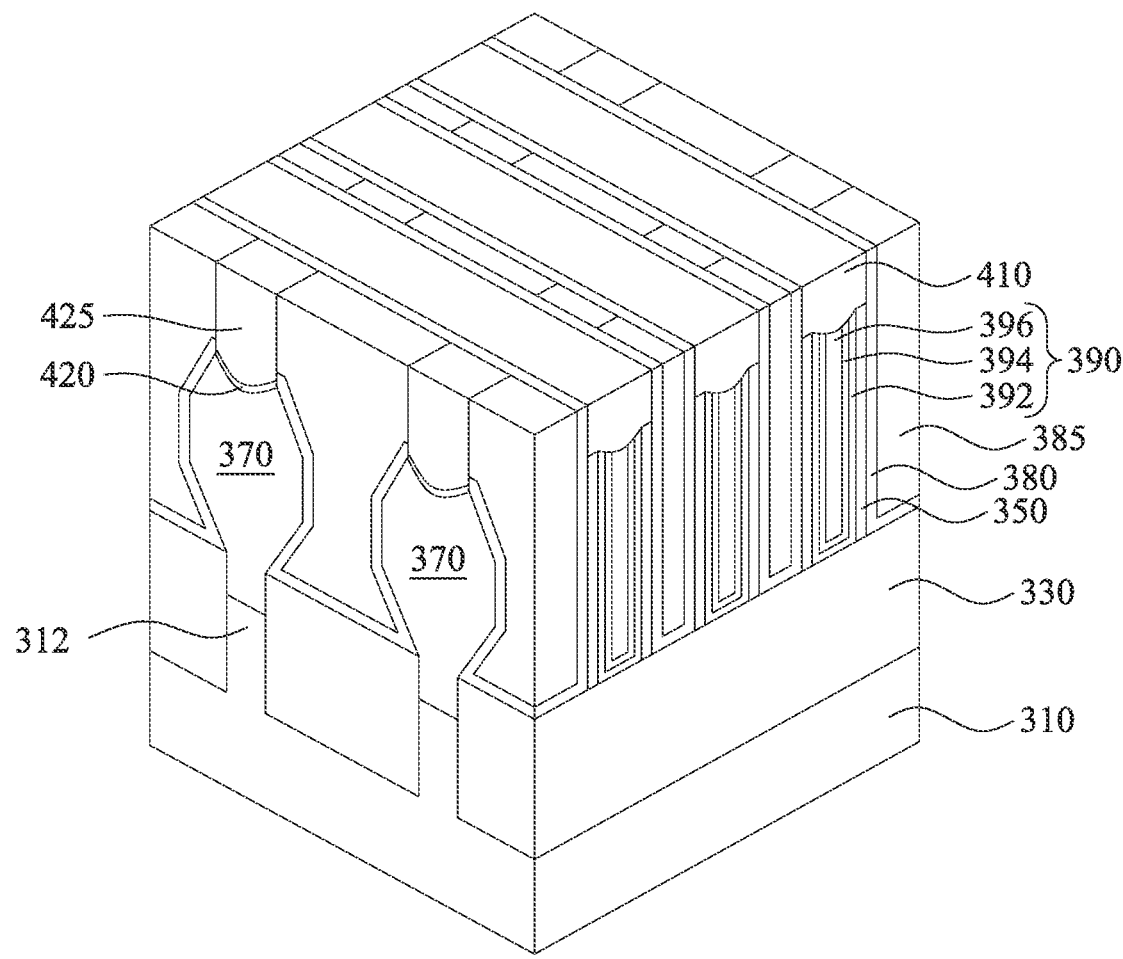

Reference is made to FIG. 40. The implantation regions 343i, the dummy gate electrode layers 343u and the dummy gate dielectric layers 341 (see FIG. 39), and the first semiconductor layers 322 (see FIG. 36) are removed, resulting in gate trenches between corresponding spacer structures 350. Thereafter, gate structures 390 including gate dielectric layers 392 and gate electrodes (including work function metal layers 394 and fill metals 396) are formed in the gate trenches. The gate structures 390 encircles (wraps) the second semiconductor layers 324, in which the second semiconductor layers 324 are referred to as channels of the semiconductor device. Stated differently, the second semiconductor layers 324 are surrounded by or embedded in the gate structures 390. Materials, configurations, dimensions, processes and/or operations regarding the gate structures 390 are similar to or the same as the gate structures 170 of FIG. 14.

In operation S64 of method Me in FIG. 23, source/drain contacts are formed above the source/drain epitaxial structures. The structure of FIG. 40 undergoes the processes similar to the processes shown in FIG. 15. That is, an etching back process is performed to etch back the replacement gate structures 390 and the spacer structures 350, and dielectric caps 410 are formed over the etched gate structures 390. Materials, configurations, dimensions, processes and/or operations regarding the dielectric caps 410 are similar to or the same as the dielectric caps 180 of FIG. 15.

After the formation of the dielectric caps 410 is completed, source/drain contacts 425 are formed extending through the ILD layer 385. In some embodiments, metal alloy layers 420 are respectively formed above the source/drain epitaxial structures 370 prior to forming the source/drain contacts 425. Materials, configurations, dimensions, processes and/or operations regarding the source/drain contacts 425 are similar to or the same as the source/drain contacts 195 of FIG. 15. Materials, configurations, dimensions, processes and/or operations regarding the metal alloy layers 420 are similar to or the same as the metal alloy layers 190 of FIG. 15.

Figure 42:
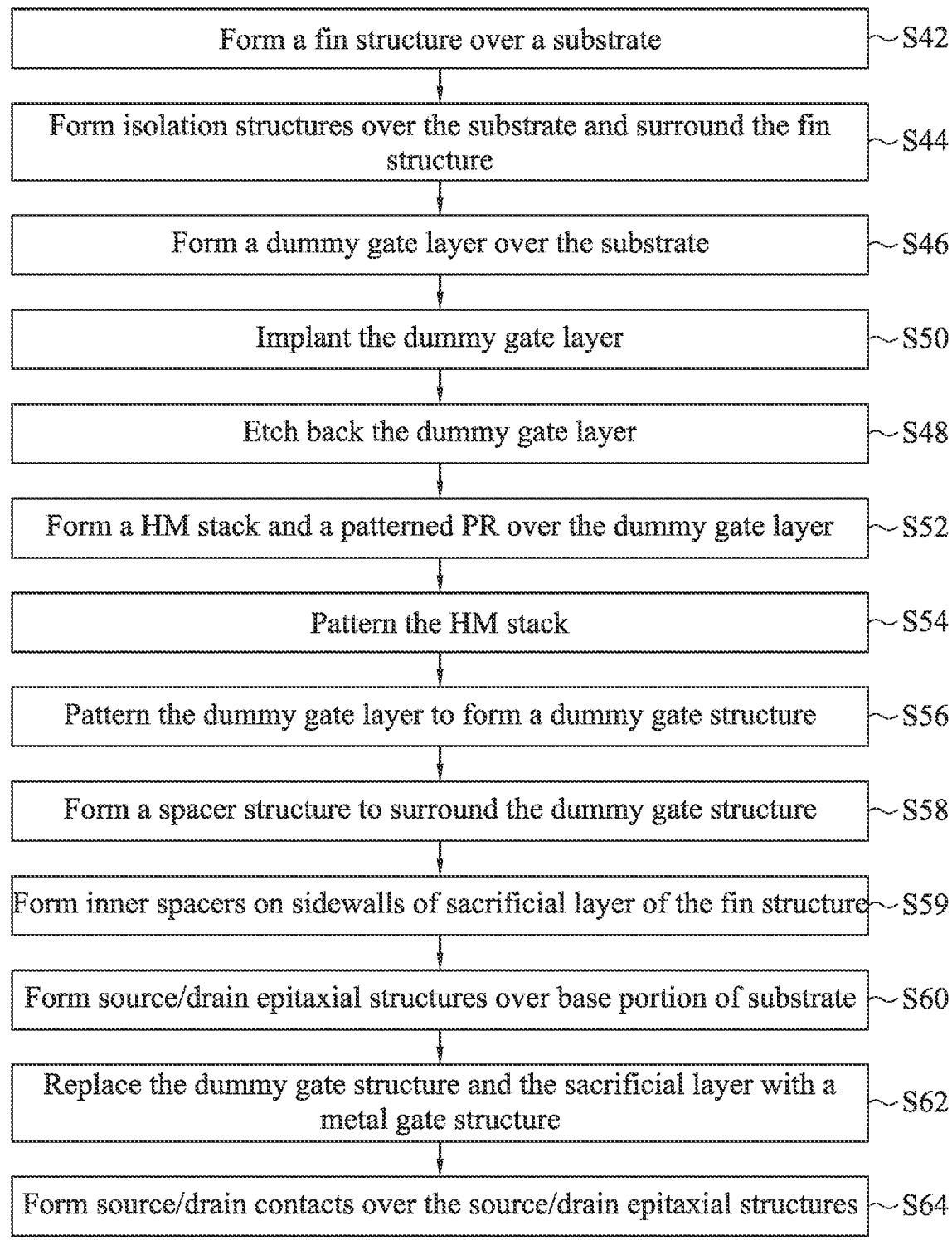
FIGS. 42-44 are flowcharts of methods for making semiconductor devices (or integrated circuit structures) according to aspects of the present disclosure in various embodiments.
Figure 43:
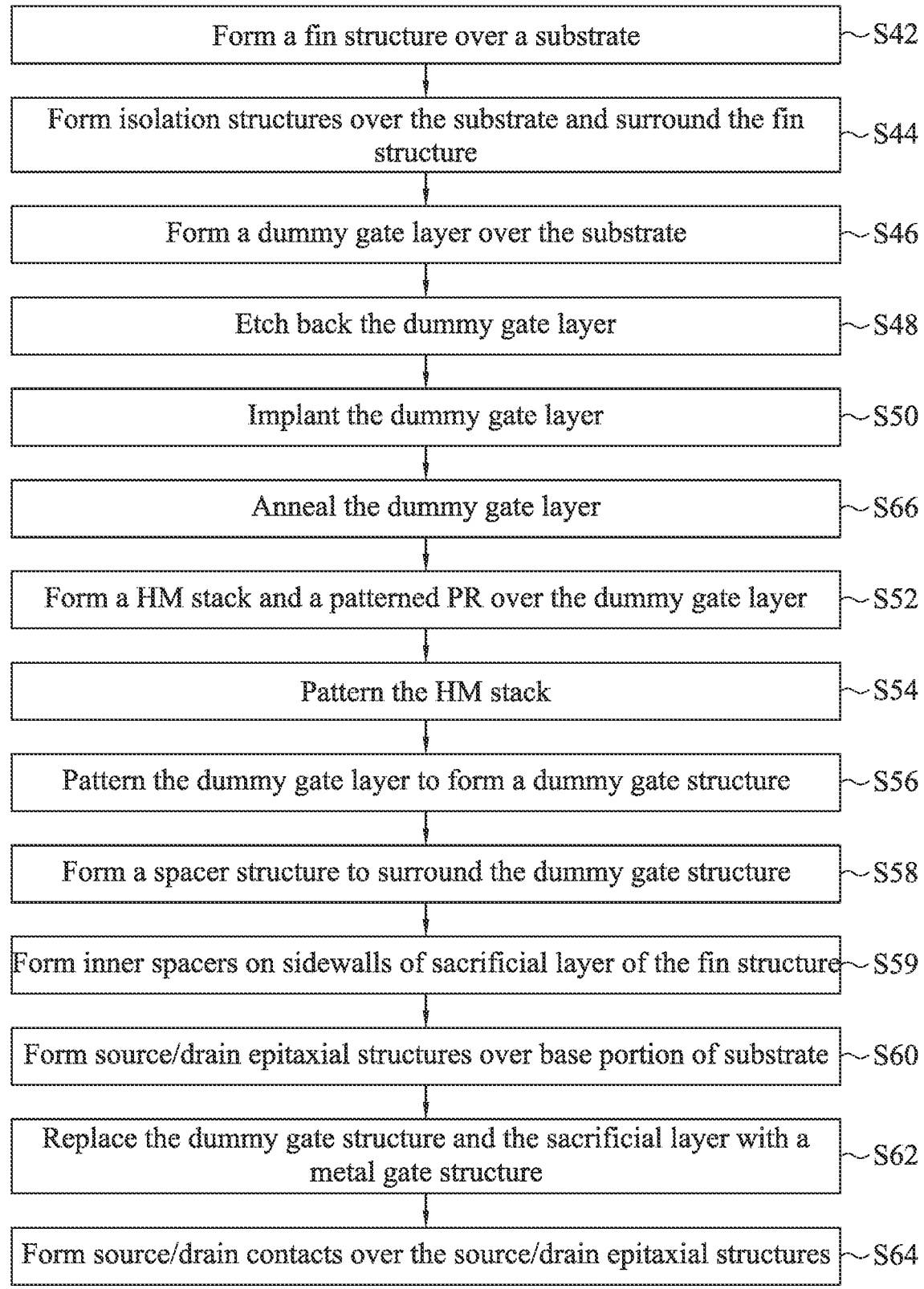
Figure 44:
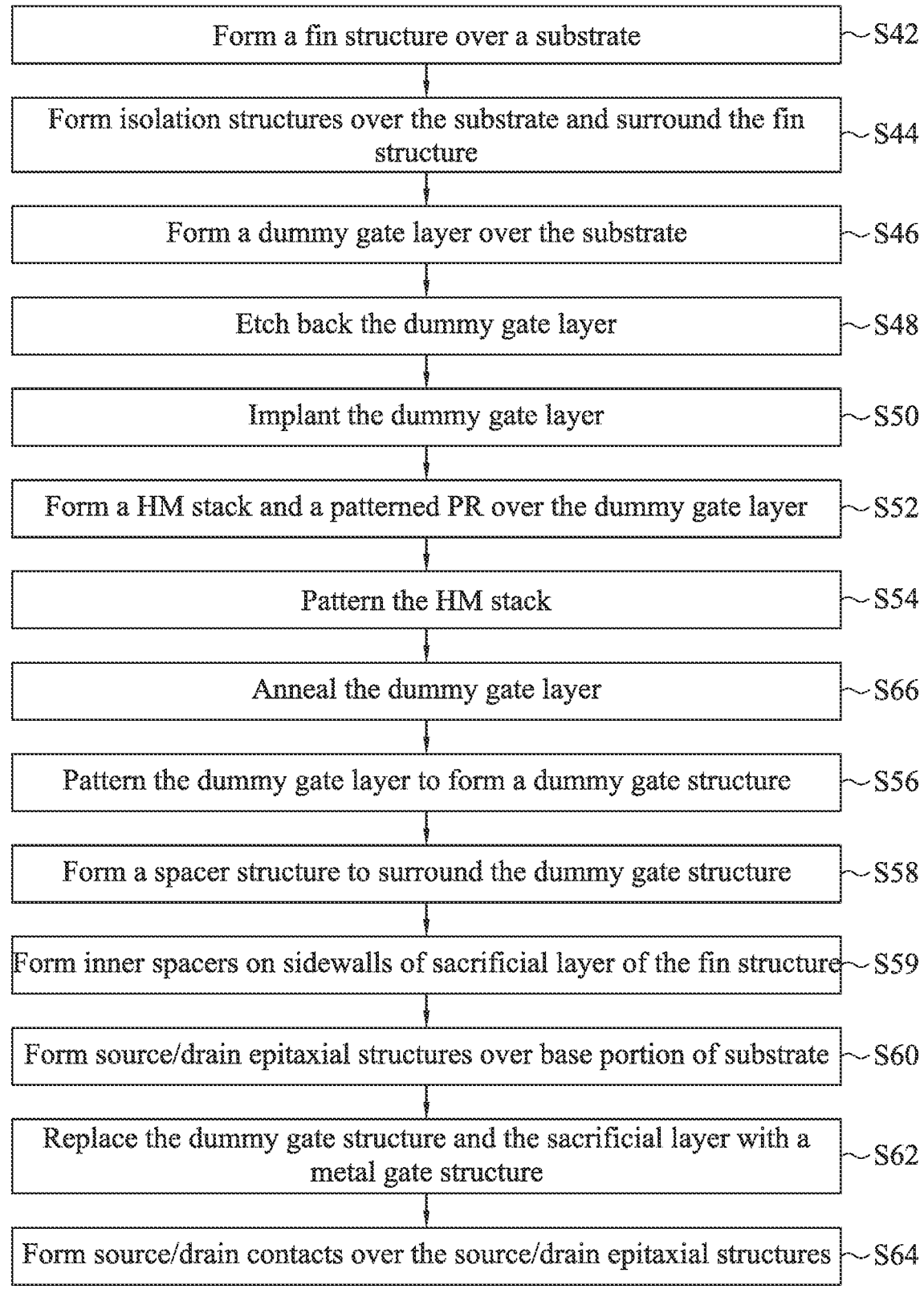

FIGS. 42-44 are flowcharts of methods Mf, Mg, and Mh for making semiconductor devices (or integrated circuit structures) according to aspects of the present disclosure in various embodiments. Throughout the various views and illustrative embodiments, like reference numbers are used to designate like elements. The present embodiment may repeat reference numerals and/or letters used in FIGS. 24-41. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices.

In some embodiments, the operation S50 (i.e., implanting the dummy gate layer) can be performed between the operations S46 and S48, as shown in the method Mf of FIG. 42. The details in operations S46, S50, and S48 are described above as shown in FIGS. 17-18, and, therefore, a description in this regard will not be repeated hereinafter.

In some embodiments, an operation S66 (i.e., annealing the implantation region) can be performed between the operations S50 and S52, as shown in the method Mg of FIG. 43. The details in operations S50, S66, and S52 are described above as shown in FIG. 20, and, therefore, a description in this regard will not be repeated hereinafter.

In some embodiments, the operation S66 (i.e., annealing the implantation region) can be performed between the operations S54 and S56, as shown in the method Mh of FIG. 44. The details in operations S54, S66, and S56 are described above as shown in FIG. 22, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the implantation region formed in the top portion of the dummy gate layer can release the stress difference between the huge stress difference between the dummy gate layer and the hard masks formed thereon. The released stress difference improves the distortion of the dummy gates, resulting in small line width variation of the dummy gates. Moreover, the short issue between the gate structures and the source/drain contacts can be improved. Further, since the implantation region is spaced apart from the channels (e.g., the semiconductor fin or fin structure) of the semiconductor device, the implantation process does not degrade the performance of the channels.

According to some embodiments, a method includes forming a fin structure over a substrate; depositing a dummy gate layer over the substrate and the fin structure; etching back the dummy gate layer; performing an implantation process to the dummy gate layer to form an implantation region in the dummy gate layer, wherein a vertical thickness of the dummy gate layer is greater than a vertical thickness of the implantation region; forming a patterned hard mask stack over the implantation region; patterning the implantation region and the dummy gate layer by using the patterned hard mask stack as an etch mask to form a dummy gate structure over the fin structure; and replacing the dummy gate structure with a metal gate structure.

According to some embodiments, a method includes forming a semiconductor fin over a substrate; forming a dummy gate layer over the semiconductor fin, wherein the dummy gate layer includes: a polycrystalline semiconductor layer over the semiconductor fin; and an amorphous semiconductor layer over the polycrystalline semiconductor layer; forming a hard mask stack over the amorphous semiconductor layer; patterning the amorphous semiconductor layer by using the hard mask stack as an etch mask; after patterning the amorphous semiconductor layer, patterning the polycrystalline semiconductor layer by using the patterned amorphous semiconductor layer as an etch mask; and replacing the patterned amorphous semiconductor layer and the patterned polycrystalline semiconductor layer with a metal gate structure.

According to some embodiments, a method includes forming a fin structure over a substrate; forming a dummy gate layer over the fin structure and the substrate, wherein the dummy gate layer includes: a bottom polycrystalline semiconductor layer over the fin structure; and a top polycrystalline semiconductor layer over the bottom polycrystalline semiconductor layer, wherein a stress of the bottom polycrystalline semiconductor layer is more compressive than a stress of the top polycrystalline semiconductor layer; patterning the dummy gate layer to form a dummy gate structure including the patterned bottom polycrystalline semiconductor layer and the patterned top polycrystalline semiconductor layer over the patterned bottom polycrystalline semiconductor layer; and replacing the dummy gate structure with a metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure over a substrate;
depositing a dummy gate layer over the substrate and the fin structure;
etching back the dummy gate layer;
performing an implantation process to the dummy gate layer to form an implantation region in the dummy gate layer, wherein a vertical thickness of the dummy gate layer is greater than a vertical thickness of the implantation region;
forming a patterned hard mask stack over the implantation region;
patterning the implantation region and the dummy gate layer by using the patterned hard mask stack as an etch mask to form a dummy gate structure over the fin structure, comprising:
performing a first etching process to etch the implantation region; and
after performing the first etching process, performing a second etching process to etch a remaining portion of the dummy gate layer, wherein the first etching process and the second etching process are both plasma etching processes, and a bias power of the first etching process is lower than a bias power of the second etching process; and
replacing the dummy gate structure with a metal gate structure.

2. The method of claim 1, wherein the vertical thickness of the implantation region is about 20% to about 50% of the vertical thickness of the dummy gate layer.

3. The method of claim 1, wherein a stress of the implantation region is closer to a neutral stress than a stress of the dummy gate layer.

4. The method of claim 1, wherein a portion of the dummy gate layer closer to the fin structure is not implanted after performing the implantation process.

5. The method of claim 1, further comprising forming a spacer structure surrounding the dummy gate structure, wherein the spacer structure is in contact with the patterned implantation region.

6. The method of claim 1, further comprising annealing the implantation region after etching back the dummy gate layer and prior to patterning the implantation region and the dummy gate layer.

7. A method comprising:
forming a fin structure over a substrate;
forming a dummy gate layer over the fin structure and the substrate, wherein the dummy gate layer comprises:
a bottom polycrystalline semiconductor layer over the fin structure; and
a top polycrystalline semiconductor layer over the bottom polycrystalline semiconductor layer, wherein a stress of the bottom polycrystalline semiconductor layer is more compressive than a stress of the top polycrystalline semiconductor layer;
patterning the dummy gate layer to form a dummy gate structure comprising the patterned bottom polycrystalline semiconductor layer and the patterned top polycrystalline semiconductor layer over the patterned bottom polycrystalline semiconductor layer, comprising:
performing a first etching process to etch the top polycrystalline semiconductor layer to form the patterned top polycrystalline semiconductor layer; and
after performing the first etching process, performing a second etching process to etch the bottom polycrystalline semiconductor layer to form the patterned bottom polycrystalline semiconductor layer, wherein the first etching process and the second etching process are both plasma etching processes, and a bias power of the first etching process is lower than a bias power of the second etching process; and
replacing the dummy gate structure with a metal gate structure.

8. The method of claim 7, wherein a dopant concentration of the top polycrystalline semiconductor layer is greater than a dopant concentration of the bottom polycrystalline semiconductor layer.

9. The method of claim 7, wherein dopants of the top polycrystalline semiconductor layer comprise germanium, xenon, argon, silicon, phosphorus, boron, or combinations thereof.

10. The method of claim 7, wherein a thickness of the bottom polycrystalline semiconductor layer is greater than a thickness of the top polycrystalline semiconductor layer.

11. The method of claim 7, wherein the bottom polycrystalline semiconductor layer and the top polycrystalline semiconductor layer are made of same materials but with different dopant concentrations.

12. The method of claim 7, wherein the stress of the top polycrystalline semiconductor layer is compressive.

13. The method of claim 7, wherein a flow rate of an etching gas used in the first etching process is lower than a flow rate of an etching gas used in the second etching process.

14. A method comprising:
forming a channel structure over a substrate;
depositing a dummy gate layer over the substrate and the channel structure, wherein the dummy gate layer is polycrystalline semiconductive;
performing an implantation process to the dummy gate layer, wherein the implantation process transforms a top portion of the dummy gate layer from polycrystalline semiconductor into amorphous semiconductor;
after performing the implantation process, performing an annealing process to the top portion of the dummy gate layer to transform the top portion of the dummy gate layer from amorphous semiconductor into polycrystalline semiconductive;
after performing the annealing process, performing a first etching process to pattern the top portion of the dummy gate layer;
performing a second etching process to pattern a bottom portion of the dummy gate layer by using the patterned top portion of the dummy gate layer as an etch mask, wherein the first etching process and the second etching process are both plasma etching processes, and a bias power of the first etching process is lower than a bias power of the second etching process; and
replacing the patterned top portion and the patterned bottom portion of the dummy gate layer with a metal gate structure.

15. The method of claim 14, wherein a bottom surface of the top portion of the dummy gate layer is higher than a top surface of the channel structure.

16. The method of claim 14, wherein the first etching process and the second etching process are performed continuously.

17. The method of claim 14, wherein a vertical thickness of the top portion of the dummy gate layer is in a range from about 1 nm to about 90 nm.

18. The method of claim 14, wherein a part of the bottom portion of the dummy gate layer is directly between the top portion of the dummy gate layer and the channel structure.

19. The method of claim 14, wherein stresses of the top portion and the bottom portion of the dummy gate layer are both compressive, but the stress of the bottom portion of the dummy gate layer is more compressive than the stress of the top portion of the dummy gate layer.

20. The method of claim 14, wherein the top portion of the dummy gate layer comprises germanium, xenon, argon, silicon, phosphorus, boron, or combinations thereof.

* * * * *